(12) United States Patent
Saito et al.

(10) Patent No.: US 9,123,581 B2
(45) Date of Patent: *Sep. 1, 2015

(54) SEMICONDUCTOR DEVICE

(75) Inventors: Toshihiko Saito, Atsugi (JP); Yutaka Shionoiri, Isehara (JP); Kiyoshi Kato, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/287,569

(22) Filed: Nov. 2, 2011

(65) Prior Publication Data
US 2012/0043388 A1 Feb. 23, 2012

Related U.S. Application Data

(62) Division of application No. 11/905,504, filed on Oct. 1, 2007, now Pat. No. 8,052,059.

(30) Foreign Application Priority Data

Oct. 2, 2006 (JP) ................................. 2006-270234

(51) Int. Cl.
*G06K 19/06* (2006.01)
*H01L 27/12* (2006.01)
(Continued)

(52) U.S. Cl.
CPC ............ *H01L 27/12* (2013.01); *G06K 19/0701* (2013.01); *G06K 19/0723* (2013.01); *H01L 21/84* (2013.01)

(58) Field of Classification Search
CPC . H01L 27/12; G06K 19/0701; G06K 19/0723
USPC .................................. 235/451, 435, 487, 492
See application file for complete search history.

(56) References Cited

U.S. PATENT DOCUMENTS 6,437,609 B1 * 8/2002 Chehadi ........................ 327/102
6,525,362 B2 * 2/2003 Sadayuki ...................... 257/298
6,659,352 B1 * 12/2003 Asada et al. .................. 235/492

(Continued)

FOREIGN PATENT DOCUMENTS

EP   1058376 A   12/2000
EP   1306741 A   5/2003

(Continued)

OTHER PUBLICATIONS

Invitation to Pay Additional Fees (Application No. PCT/JP2007/069327) Dated Oct. 30, 2007.

(Continued)

*Primary Examiner* — Paultep Savusdiphol
(74) *Attorney, Agent, or Firm* — Eric J. Robinson; Robinson Intellectual Property Law Office, P.C.

(57) ABSTRACT

An object of the present invention is to provide a semiconductor device which can obtain the high potential necessary for writing data to a memory, using a small circuit area. In the present invention, by using as input voltage of a booster circuit not the conventionally used output VDD of a regulator circuit 104, but rather an output VDD0 of a rectifier circuit portion 103, which is a higher potential than the VDD, the high potential necessary for writing data to a memory can be obtained with a small circuit area.

22 Claims, 16 Drawing Sheets

(51) Int. Cl.
*G06K 19/07* (2006.01)
*H01L 21/84* (2006.01)

(56) References Cited

U.S. PATENT DOCUMENTS

| | | | |
|---|---|---|---|
| 6,963,269 B2 * | 11/2005 | Saitoh et al. | 340/10.1 |
| 6,970,690 B2 | 11/2005 | Yajima et al. | |
| 7,158,009 B2 | 1/2007 | Watanabe | |
| 7,494,066 B2 * | 2/2009 | Koyama et al. | 235/492 |
| 7,832,647 B2 * | 11/2010 | Ikeda et al. | 235/492 |
| 2002/0056865 A1 * | 5/2002 | Sadayuki | 257/298 |
| 2002/0097144 A1 | 7/2002 | Collins et al. | |
| 2004/0227619 A1 * | 11/2004 | Watanabe | 340/10.34 |
| 2005/0133605 A1 | 6/2005 | Koyama et al. | |
| 2008/0093461 A1 | 4/2008 | Marushima et al. | |

FOREIGN PATENT DOCUMENTS

| | | |
|---|---|---|
| EP | 1752914 A | 2/2007 |
| JP | 06-004857 | 1/1994 |
| JP | 11-196540 | 7/1999 |
| JP | 2001-189091 A | 7/2001 |
| JP | 2003-132316 A | 5/2003 |
| JP | 2004-303175 A | 10/2004 |
| JP | 3646472 | 5/2005 |
| JP | 2005-202943 | 7/2005 |
| JP | 2005-321911 | 11/2005 |
| JP | 2006-180073 | 7/2006 |
| WO | WO-2005/116914 | 12/2005 |

OTHER PUBLICATIONS

International Search Report (Application No. PCT/JP2007/069327) dated Jan. 22, 2008.
Written Opinion (Application No. PCT/JP2007/069327) dated Jan. 22, 2008.
Chinese Office Action (Application No. 200780036911.8) dated May 25, 2011.
Chinese Office Action (Application No. 200780036911.8) Dated Apr. 12, 2012.
Korean Office Action (Application No. 2009-7004680) Dated Jul. 5, 2013.
Taiwanese Office Action (Application No. 96136746) Dated Aug. 23, 2013.
European Search Report (Application No. 07829066.5) Dated Jun. 3, 2015.

* cited by examiner

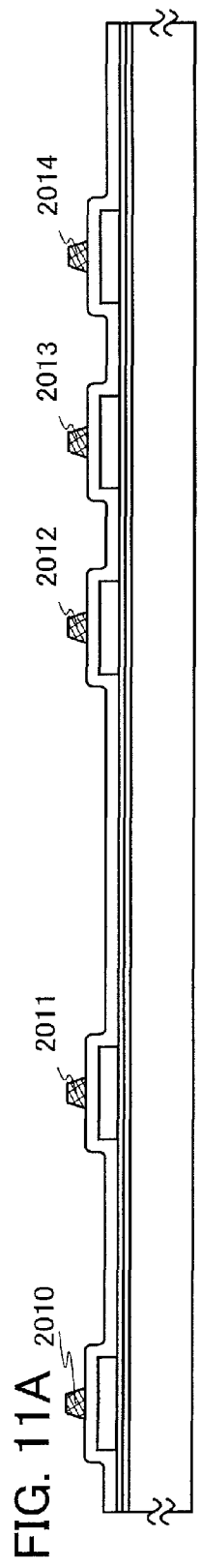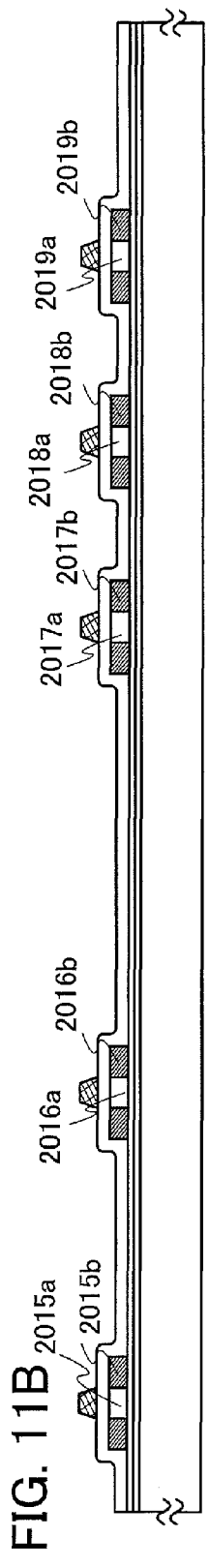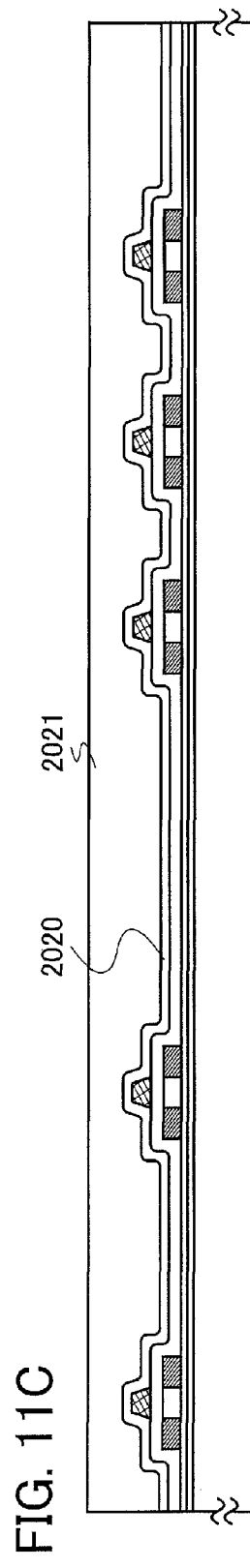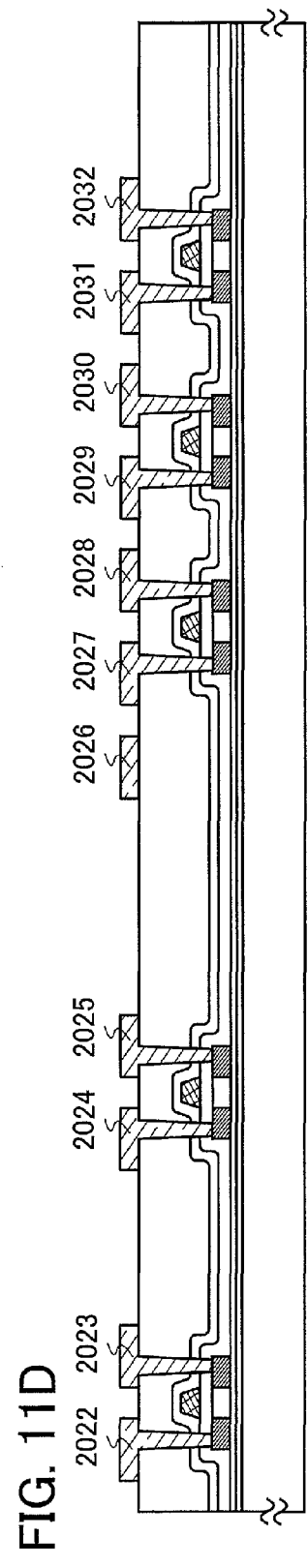

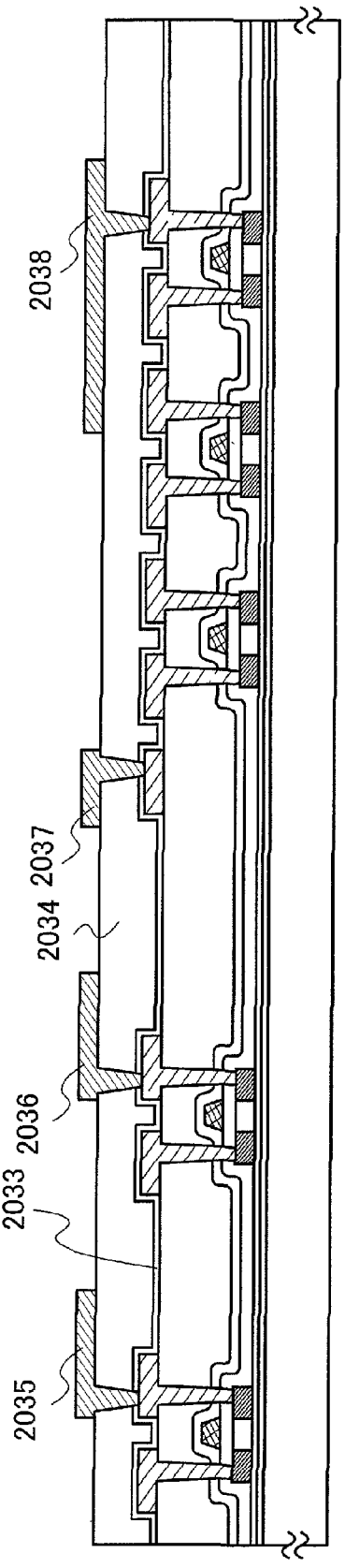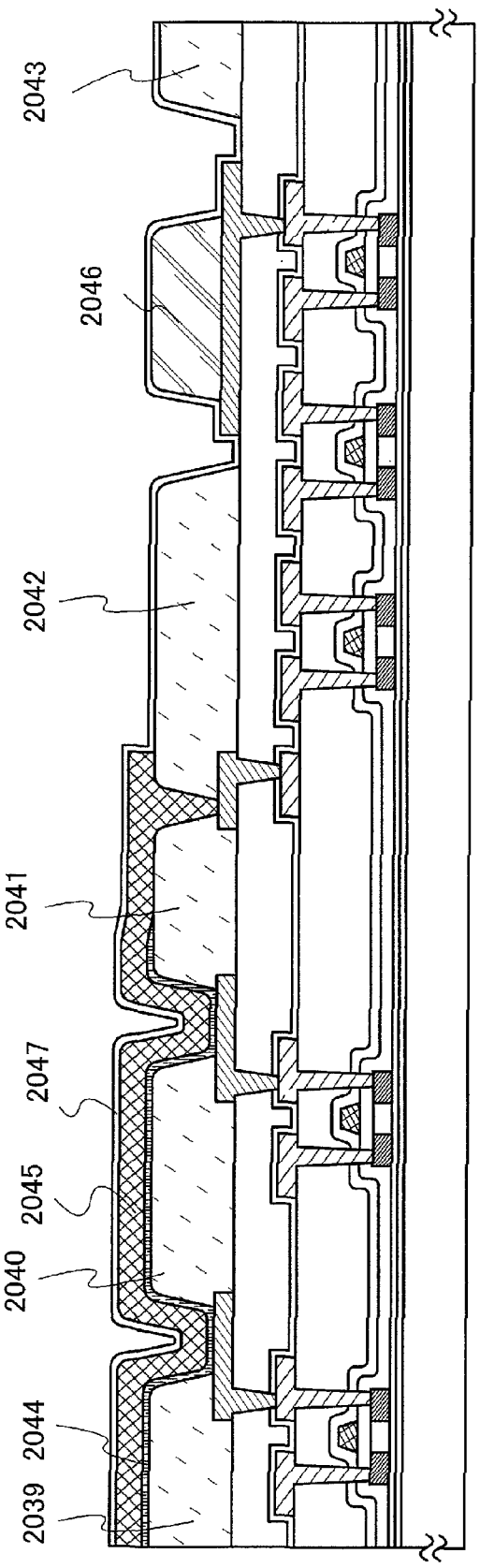

1200

1201

1202

1203

1204

1205

1206

SEMICONDUCTOR DEVICE

TECHNICAL FIELD

The present invention relates to semiconductor devices. In particular, the present invention relates to semiconductor devices which can transmit and receive data contactlessly and can store data.

BACKGROUND ART

In recent years, individual identification technology such as that which gives ID (individual identification numbers) to individual objects and thereby makes information of the objects, such as their history, clear, and makes use of it in production, management, and the like has attracted attention. Among this technology, the development of semiconductor devices which can transmit and receive data contactlessly has been promoted. In particular, semiconductor devices such as these that are beginning to be introduced into businesses, the market, and the like are processor chips (also referred to as RFIDs (radio frequency identification chips), ID tags, IC tags, IC chips, RF tags, wireless tags, electronic tags, and wireless chips) and the like.

Many of these semiconductor devices include a circuit which employs a semiconductor substrate formed of silicon (Si) or the like (hereinafter also referred to as an IC (integrated circuit) chip), and an antenna, and the IC chip includes a memory circuit (hereinafter also referred to as a memory), a control circuit, and the like.

A conventional example of an RFID will be described below with reference to FIG. 16. In FIG. 16, an RFID 700 includes an antenna portion 702 which receives radio waves; a rectifier circuit portion 703 which rectifies output of the antenna portion 702; a regulator circuit 704 which receives output of the rectifier circuit portion 703 and outputs an operating voltage VDD to other circuits; a clock generation circuit 705 which generates clocks; a logic circuit 706 which controls another circuit; a memory 708 which receives output from the logic circuit 706 and performs data writing and reading; and a booster circuit 707 which receives output of the regulator circuit 704 and output of the clock generation circuit 705 and supplies a voltage for writing data to the memory 708.

Besides these circuits, the RFID includes a data modulation/demodulation circuit, a sensor, an interface circuit, and the like, although they are not illustrated.

A reader/writer 701 is a device which writes and reads data to and from the RFID 700 contactlessly from outside.

The antenna portion 702 includes an antenna and a resonant capacitor. The antenna portion 702 takes in a radio wave transmitted from the reader/writer 701, and applies a signal RF_IN obtained at that time to the rectifier circuit portion 703. The rectifier circuit portion 703 includes a diode for rectifying, and a smoothing capacitor. The rectifier circuit portion 703 smoothes RF_IN and generates a voltage VDD0.

The received power which the antenna portion 702 receives is very dependent on the distance of the antenna portion 702 from the reader/writer 701. Therefore, the regulator circuit 704, which puts out a specific output in response to a voltage which is input, is included within the RFID 700 with the aim of preventing the logic circuit and the like from breaking down due to overvoltage which occurs when a chip is placed very near to the reader/writer. The output VDD of the regulator circuit 704 is used as an operating power supply voltage of the logic circuit 706 and as a power supply voltage for when the memory 708 performs a reading operation. When such a structure is employed, the RFID can be operated without a battery.

To perform an operation of writing data to the memory, it is necessary to apply a voltage with a higher potential than that of a voltage used when reading is performed. As a method of generating such a voltage, a method in which the booster circuit is used to boost voltage, based on the output VDD of the regulator circuit, is often used. In FIG. 16, when the output VDD of the regulator circuit 704 and a clock CLK which the clock generation circuit 705 outputs are input to the booster circuit 707, a high power supply potential VDD_HI is obtained as output. Using this VDD_HI, writing is performed to the memory. As an example of using a booster circuit to generate a voltage for writing data to a memory in such an RFID, Reference 1 (Japanese Published Patent Application No. 2006-180073) can be given.

DISCLOSURE OF INVENTION

Generally, it is considered desirable for VDD, which is the output of the regulator circuit, to be as low as possible so that power consumption within the RFID is suppressed and communication range is extended. However, when the potential of VDD is low (in particular, 2 V or less), there are problems such as the fact that even when a booster circuit is used to boost voltage, the necessary potential for writing to the memory cannot be obtained, or the area required for the booster circuit in order to obtain the necessary potential increases.

The present invention has been made in view of the foregoing considerations. An object of the present invention is to generate a necessary voltage for a memory writing operation without increasing circuit area, while suppressing power consumption.

In order to achieve the above object, the present invention provides the following means:

A semiconductor device of the present invention includes an antenna portion which receives radio waves from outside, a rectifier circuit portion which rectifies output of the antenna portion and outputs a direct current voltage, and a regulator circuit which receives output of the rectifier circuit portion and outputs a specific voltage. The output of the rectifier circuit portion is used as a first power supply potential, and the output of the regulator circuit is used as a second power supply potential.

In addition to the above-described structure, a semiconductor device of the present invention may further include a booster circuit which boosts the first power supply potential, and a clock generation circuit. The second power supply potential is input to the clock generation circuit and the clock generation circuit generates a clock for the booster circuit.

In addition to an above-described structure, a semiconductor device of the present invention may further include a level shifter. The first power supply potential and output of the clock generation circuit are input to the level shifter and the level shifter amplifies the output of the clock generation circuit and outputs the amplified output of the clock generation circuit as a clock of the booster circuit.

In addition to an above-described structure, a semiconductor device of the present invention may further include a memory into which output of the booster circuit is input as a data writing potential and into which the second power supply potential is input as a data reading potential.

In addition to an above-described structure, a semiconductor device of the present invention may further include a memory into which the first power supply potential is input as a data writing potential and the second power supply potential is input as a data reading potential.

A semiconductor device of the present invention includes a first booster circuit which boosts a first power supply potential; a second booster circuit which boosts output of the first booster circuit; a clock generation circuit, into which a second power supply potential is input, and which generates clocks for the first booster circuit and the second booster circuit; and a memory, into which the output of the first booster circuit is input as a data writing potential, output of the second booster circuit is input as a data erasing potential, and the second power supply potential is input as a data reading potential.

A semiconductor device of the present invention may further include a level shifter into which the first power supply potential and output of the clock generation circuit are input. The level shifter amplifies the output of the clock generation circuit, and outputs the amplified output of the clock generation circuit as a clock of the first booster circuit and the second booster circuit.

A semiconductor device of the present invention may further include a charging element which stores charge. The charging element may be a capacitor or a secondary battery.

In a semiconductor device of the present invention, the charging element may be provided with a switching element.

In the present invention, by using as an input voltage of a booster circuit not the conventionally used output VDD of a regulator circuit but rather an output VDD0 of a rectifier circuit, which is a higher potential than the VDD, a high potential necessary for writing data to a memory can be obtained with a small circuit area. Further, because the output VDD of the regulator circuit is used as an operating voltage for other circuits, power consumption can be suppressed.

BRIEF DESCRIPTION OF DRAWINGS

FIGS. 11A to 11D are cross sections showing manufacturing steps of a circuit of Embodiment 2 of the present invention.

FIGS. 12A and 12B are cross sections showing manufacturing steps of a circuit of Embodiment 2 of the present invention.

BEST MODES FOR CARRYING OUT THE PRESENT INVENTION

Hereinafter, embodiment modes of the present invention will be described in detail with reference to the accompanying drawings. However, the present invention is not limited to the following description, and those skilled in the art will readily appreciate that a variety of modifications can be made to the modes and their details without departing from the spirit and scope of the present invention. Accordingly, the present invention should not be construed as being limited to the description of the embodiment modes below. Note that in the structures of the present invention described below, repetitive description of like parts and parts with similar functions is omitted.

Embodiment Mode 1

The first embodiment mode of the present invention will be described below with reference to the drawings.

Figure 1:
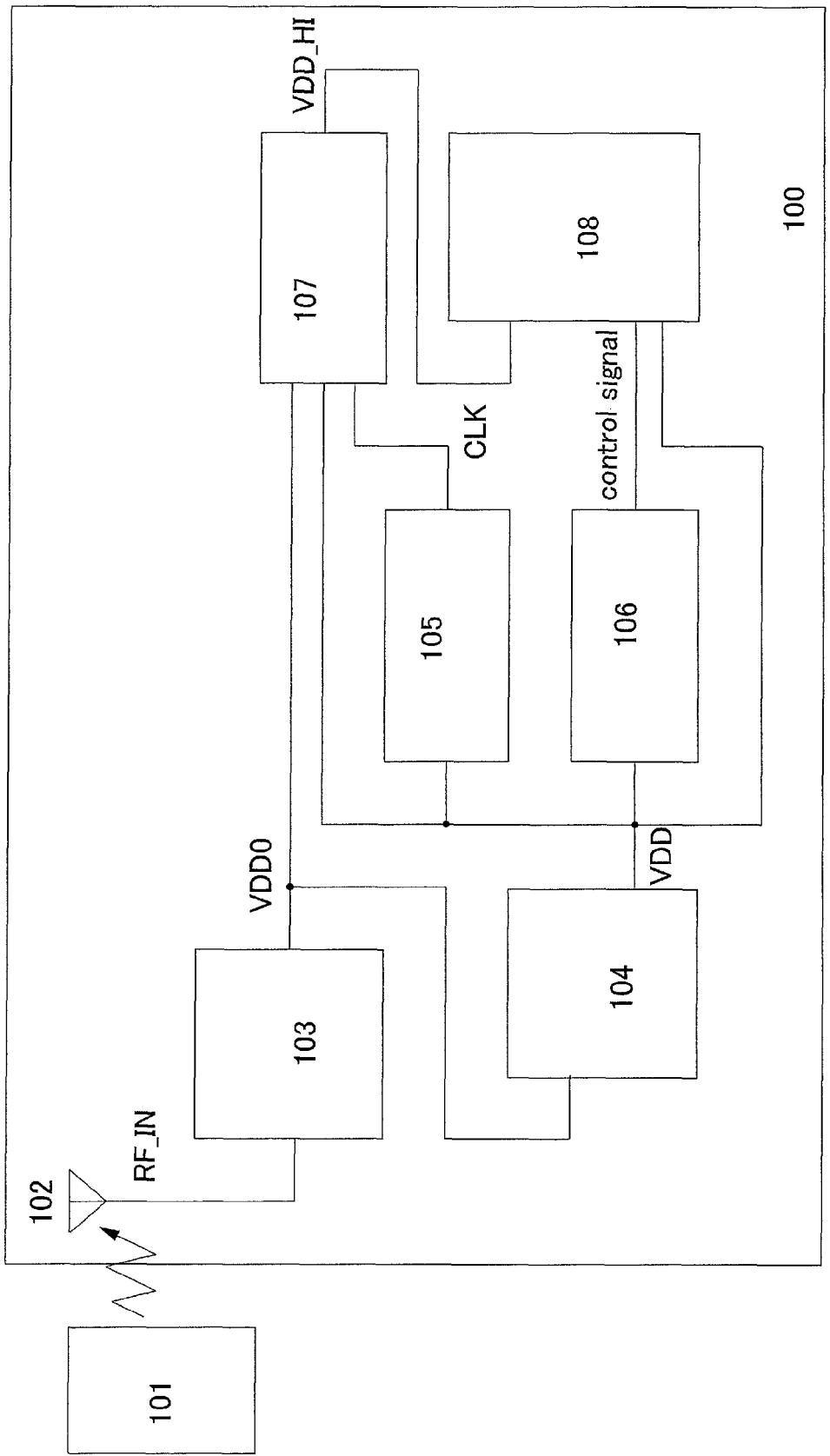
FIG. 1 is a block diagram showing Embodiment Mode 1 of the present invention.

FIG. 1 is a block diagram which shows an RFID to which the present invention has been applied. An RFID 100 in FIG. 1 includes an antenna portion 102 which receives radio waves; a rectifier circuit portion 103 which rectifies output of the antenna portion 102; a regulator circuit 104 which receives output of the rectifier circuit portion 103 and outputs an operating voltage VDD to other circuits; a clock generation circuit 105 which generates clocks; a logic circuit 106 which controls another circuit; a memory 108 which receives output from the logic circuit 106 and performs data writing and reading; and a booster circuit 107 which receives output of the rectifier circuit portion 103 and output of the clock generation circuit 105 and supplies a voltage for writing data to the memory 108.

Note that besides these circuits, the RFID 100 may also include a data modulation/demodulation circuit, a sensor, an interface circuit, and the like, although they are not illustrated.

A reader/writer 101 is a device which writes and reads data to and from the RFID 100 contactlessly from outside.

The antenna portion 102 includes an antenna and a resonant capacitor. The antenna portion 102 takes in a radio wave transmitted from the reader/writer 101, and outputs a signal RF_IN which is obtained to the rectifier circuit portion 103.

The rectifier circuit portion 103 includes a diode for rectifying, and a smoothing capacitor. The rectifier circuit portion 103 smoothes RF_IN, which is output of the antenna portion 102, and generates a voltage VDD0 (a first power supply potential).

A primary aim of the regulator circuit 104 is to prevent the logic circuit 106 and the like from breaking down due to overvoltage which occurs when, for example, the RFID 100 is placed very near to the reader/writer 101. The regulator circuit 104 is a regulator circuit which puts out a specific output in response to a voltage which is input. Through the regulator circuit 104, the output VDD0 of the rectifier circuit portion 103 becomes a voltage VDD (a second power supply potential) which has a certain specific value which is lower than VDD0. The voltage VDD serves as operating voltage for the clock generation circuit 105 and the logic circuit 106, and is used as a power supply voltage in the memory 108 when reading is performed.

Because the output VDD from the regulator circuit 104 serves as an operating voltage for other circuits, in order to suppress power consumption, it is desirable that the output VDD is a low voltage. Specifically, in the case of the RFID of this embodiment mode, 1 V to 3 V is suitable as the output VDD, and 1.5 V to 2 V is preferable as the output VDD.

The clock generation circuit 105 receives the output VDD from the regulator circuit 104 and generates a clock signal CLK. A known structure can be used as the clock generation circuit 105. For example, the clock signal CLK may be generated by dividing a radio wave taken in from the antenna portion 102. Alternatively, the clock signal CLK may be generated using an oscillator circuit such as a ring oscillator or a VCO.

The logic circuit 106 receives the output VDD from the regulator circuit 104 and controls another circuit. In this embodiment mode, according to a control signal, operations of reading and writing and the like to the memory 108 and address information and the like for performing those operations are transmitted to the memory 108.

The booster circuit 107 takes in the output VDD0 of the rectifier circuit portion 103 and the output CLK of the clock generation circuit 105. The booster circuit 107 uses the CLK to boost the voltage of VDD0 and outputs a high potential VDD_HI. It is desirable that VDD0 is a high voltage. In the RFID of this embodiment mode, it is desirable that VDD0 is equal to or greater than 3 V.

The memory 108 receives the control signal from the logic circuit 106, and performs a specified operation (data writing, reading, or the like) to an address specified by the control signal. In the case of data writing, data writing is performed using the output VDD_HI from the booster circuit 107. In the case of data reading, the operation is performed using the output VDD of the regulator circuit 104.

According to this structure, operations such as writing data to the memory 108 and reading data from the memory 108 can be performed by the RFID 100 receiving a signal from the reader/writer 101 and the logic circuit 106 performing control.

Note that the booster circuit 107 may have a known structure. For example, a circuit in which a diode, an inverter, and a capacitor means (a capacitor) are combined, such as the one shown in FIG. 2, can be used.

Figure 2:
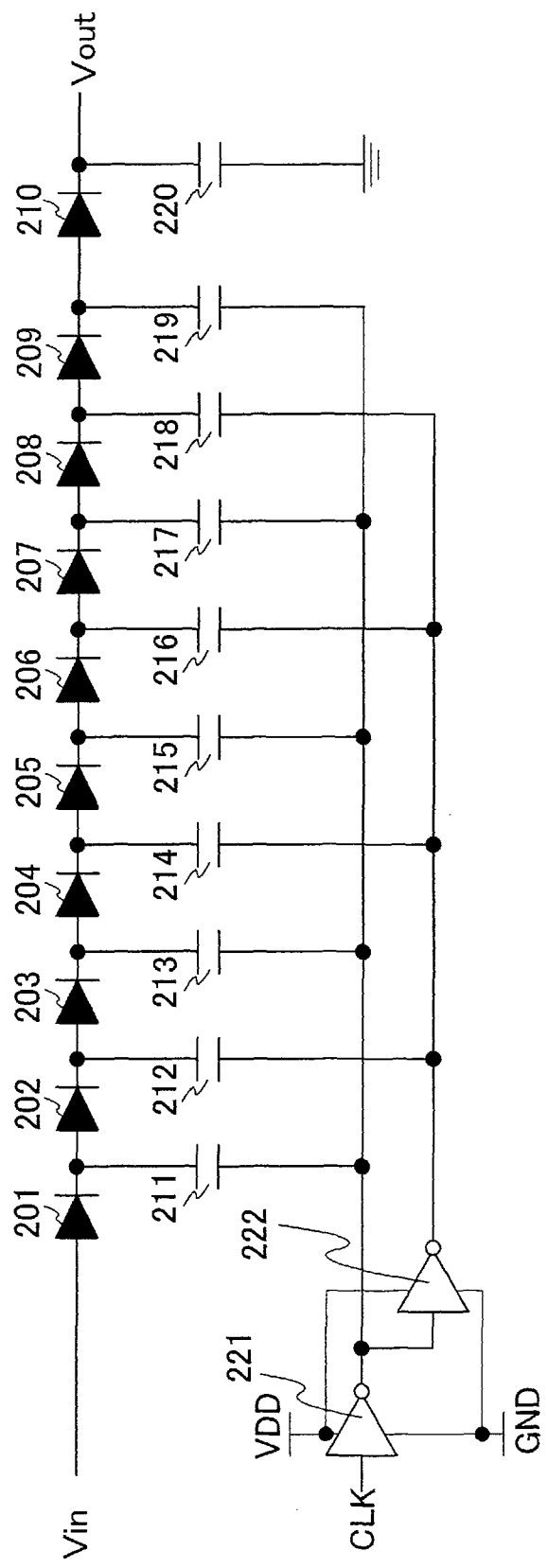
FIG. 2 is a circuit diagram of a booster circuit which is used in Embodiment Mode 1 of the present invention.

FIG. 2 is a block diagram showing a simple structural example of a booster circuit. In the example, one diode and one capacitor means is a basic unit, and there are nine stages lined up. The booster circuit shown in FIG. 2 includes ten diodes 201 to 210 which are connected in series, and ten capacitor means 211 to 220. One end of each of the capacitor means 211 to 220 is connected to an output portion of one of the diodes 201 to 210. The booster circuit also includes an inverter 221 into which a clock CLK is input, and an inverter 222 into which output of the inverter 221 is input. Other ends of capacitor means in odd-numbered stages (stages 1, 3, 5, 7, and 9); that is, capacitor means 211, 213, 215, 217, and 219; are connected to an output of the inverter 221. Other ends of capacitor means in even-numbered stages (stages 2, 4, 6, and 8); that is, capacitor means 212, 214, 216, and 218; are connected to an output of the inverter 222. One end of the capacitor means 220 is connected to the output portion of the diode 210, and the other end of the capacitor means 220 is grounded.

In a booster circuit with such a structure, a voltage Vin applied to the diode 201 is boosted at each stage by a voltage of the clock CLK being added to it, and is output from the output portion of the diode 210 as a high voltage Vout. In FIG. 2, the potential of the clock CLK is VDD.

Therefore, in a booster circuit with such a structure, the more stages there are, the higher voltage is boosted; however, the more stages there are, the larger the area of the circuit is. Further, if the voltage Vin which is input and the voltage of the clock CLK are high, high voltage can be obtained even with a small number of stages (that is, with a small circuit area).

In this embodiment mode, as shown in FIG. 1, by using as the input voltage Vin of the booster circuit not the conventionally used output VDD of the regulator circuit 104, but rather the output VDD0 of the rectifier circuit portion 103, which is a higher potential than the VDD, the high potential VDD_HI necessary for writing data to the memory can be obtained with a small circuit area. Because the output VDD of the regulator circuit 104 is used as operating voltage for other circuits, power consumption can be suppressed.

Note that since the capacitor means 220 disposed in the final stage of the booster circuit in FIG. 2 smoothes a waveform of output, capacitance of the capacitor means 220 is higher than that of the capacitor means 211 to 219. The diodes 201 to 210 have a function of preventing accumulated charge from flowing backward to previous stages.

For the diodes and the capacitor means, any structure which performs the function of a diode or a capacitor, respectively, may be used. For example, the diodes can be formed by connecting one end of a source or a drain of a thin film transistor to a gate line; and the capacitor means can be formed by connecting both an end of a source and an end of a drain of a thin film transistor together as one end of the capacitor means, and using a gate line as another end of the capacitor means.

Further, because the output VDD0 of the rectifier circuit portion 103 in FIG. 1 is directly input to the diodes used in the booster circuit, it is desirable that the diodes have a higher withstand voltage than elements such as thin film transistors which are usually used in a logic circuit. Specifically, when a thin film transistor is used, preferably it has a gate length of equal to or greater than 6 μm.

When the gate length is increased, area increases to some extent; however, since the proportion of area the diodes occupy within the booster circuit is small, this is not a large problem. Specifically, the ratio of the area of the diodes with respect to the area of the booster circuit is equal to or less than 0.5%. Further, the more the number of stages necessary for boosting voltage can be decreased by using the present invention, the more the area can be decreased.

In this embodiment mode, it is preferable to use a write-once memory for the memory 108. For example, a fuse memory, which short-circuits in a steady state and opens when a high voltage is applied, or conversely an anti-fuse memory, which is open in a steady state and short-circuits when a high voltage is applied, can be applied as a memory element included in the memory 108. A known structure can be used as the structure of the memory 108. Generally, it is necessary to apply a voltage of approximately 10 V or more when writing data to the memory.

Embodiment Mode 2

The second embodiment mode of the present invention will be described below with reference to the drawings.

Figure 3:
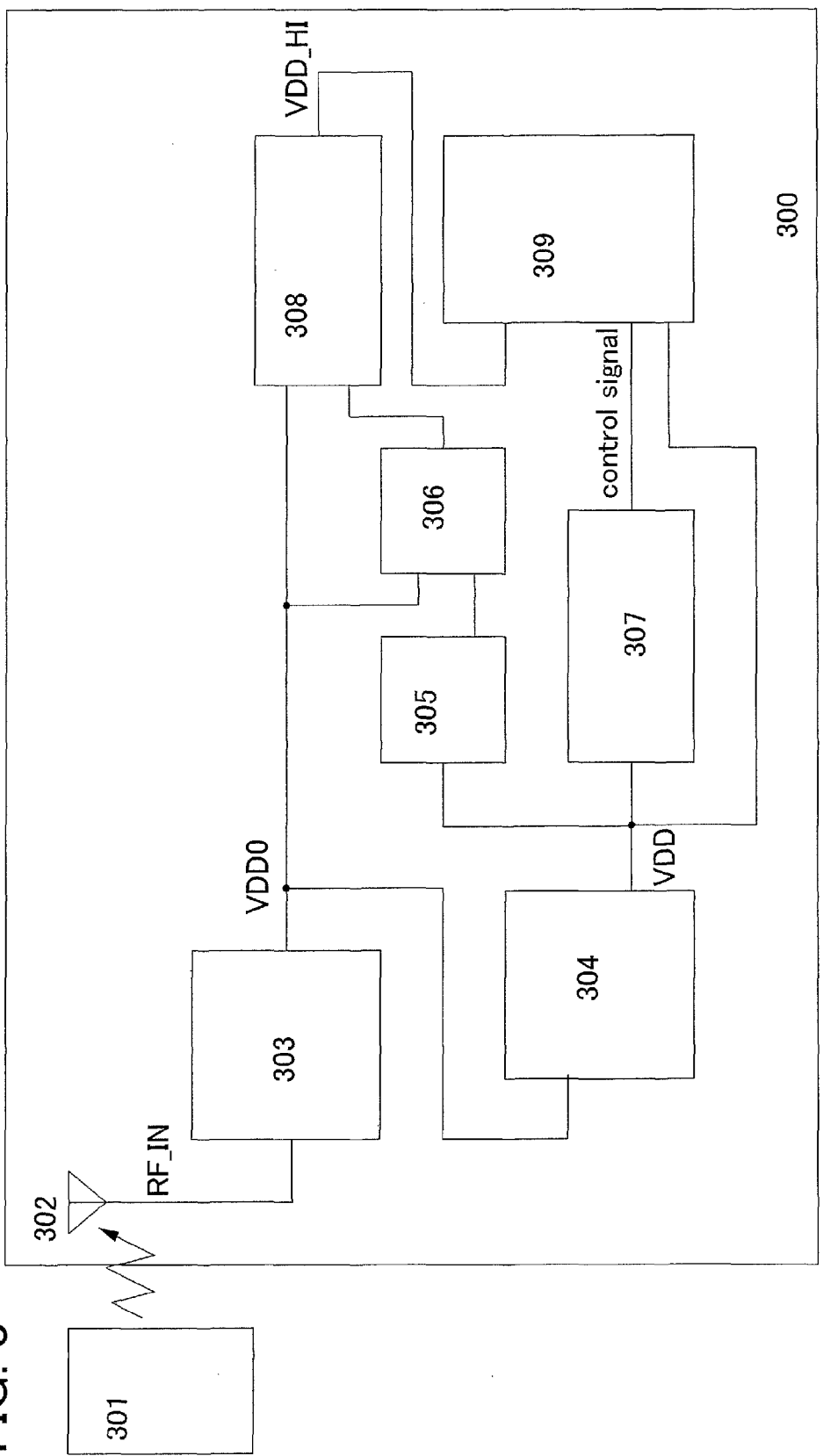
FIG. 3 is a block diagram showing Embodiment Mode 2 of the present invention.

FIG. 3 is a block diagram illustrating an RFID to which the present invention has been applied. In FIG. 3, an RFID 300 includes an antenna portion 302 which receives radio waves; a rectifier circuit portion 303 which rectifies output of the antenna portion 302; a regulator circuit 304 which receives output of the rectifier circuit portion 303 and outputs an operating voltage VDD to other circuits; a clock generation circuit 305 which generates clocks; a level shifter 306 which receives output from the clock generation circuit 305 and output from the rectifier circuit portion 303, amplifies the output of the clock generation circuit 305, and outputs the amplified output of the clock generation circuit 305; a logic circuit 307 which controls another circuit; a memory 309 which receives output from the logic circuit 307 and performs data writing and reading; and a booster circuit 308 which receives output of the rectifier circuit portion 303 and output of the level shifter 306 and supplies a voltage for writing data to the memory 309.

Note that besides these circuits, the RFID 300 may also include a data modulation/demodulation circuit, a sensor, an interface circuit, and the like, although they are not illustrated.

A reader/writer 301 is a device which writes and reads data to and from the RFID 300 contactlessly from outside.

This embodiment mode has the structure of Embodiment Mode 1, with the addition of the level shifter 306. Therefore, description of parts of the structures other than the level shifter 306 will be omitted.

The level shifter 306 amplifies a clock CLK which is output from the clock generation circuit 305. Specifically, when the output VDD0 of the rectifier circuit portion 303 is put into the level shifter 306 without having passed through the regulator circuit 304, the potential level of the clock CLK is raised from the level of VDD to the level of VDD0.

In the booster circuit 308, as described in Embodiment Mode 1 using FIG. 2, voltage is boosted when the voltage of the clock CLK is added to the input voltage VDD0. Therefore, because the voltage of the clock CLK is boosted from the level of VDD to the level of VDD0 by the level shifter 306, a high voltage can be obtained even with fewer stages (that is, with a small circuit area).

Therefore, in this embodiment mode, as shown in FIG. 3, by using as the input voltage of the booster circuit not the conventionally used output VDD of the regulator circuit 304, but rather the output VDD0 of the rectifier circuit 303, which is a higher potential than the VDD, and by raising the CLK of the booster circuit from VDD to VDD0 using the level shifter 306, the high potential VDD_HI necessary for writing data to the memory can be obtained with an even smaller circuit area. Because the output VDD of the regulator circuit 304 is used as operating voltage for other circuits, power consumption can be suppressed.

Figure 4:
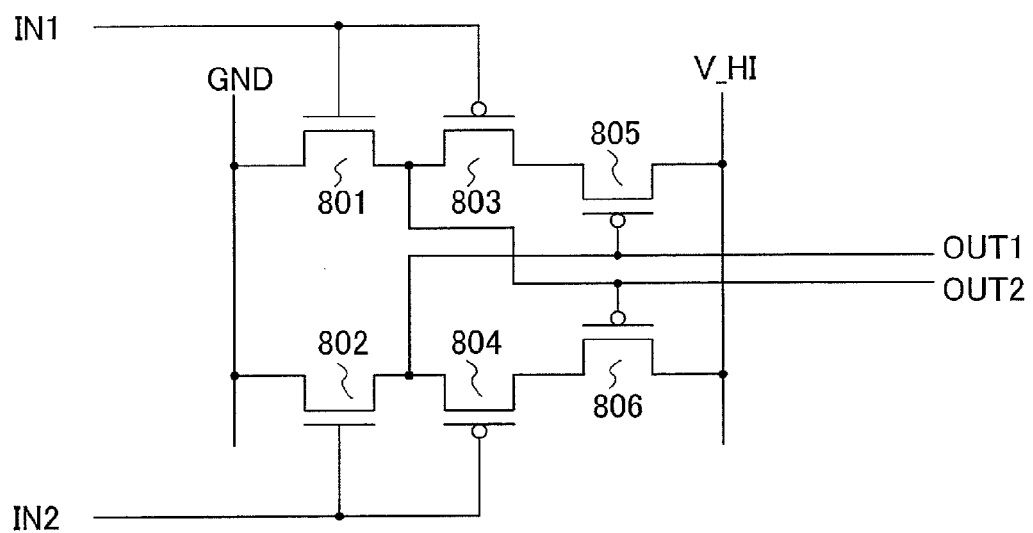
FIG. 4 is a circuit diagram of a level shifter used in Embodiment Mode 2 of the present invention.

Note that a known structure may be used for the level shifter 306. For example, a circuit which includes thin film transistors with two kinds of polarity, such as that shown in FIG. 4, can be used. FIG. 4 is a simple example of a level shifter, and includes n-type transistors 801 and 802 and p-type transistors 803 to 806.

As shown in FIG. 4, a drain of the n-type transistor 801 is grounded, and a source of the n-type transistor 801 is connected to a drain of the p-type transistor 803. A source of the p-type transistor 803 is connected to a drain of the p-type transistor 805, and a source of the p-type transistor 805 is connected to a V_HI terminal.

Similarly, a drain of the n-type transistor 802 is grounded, and a source of the n-type transistor 802 is connected to a drain of the p-type transistor 804. A source of the p-type transistor 804 is connected to a drain of the p-type transistor 806, and a source of the p-type transistor 806 is connected to the V_HI terminal.

Gates of the n-type transistor 801 and the p-type transistor 803 are connected to an input terminal IN1, and gates of the n-type transistor 802 and the p-type transistor 804 are connected to an input terminal IN2. The drain of the p-type transistor 804 and a gate of the p-type transistor 805 are connected to an output terminal OUT1, and the drain of the p-type transistor 803 and a gate of the p-type transistor 806 are connected to an output terminal OUT2.

In a case where the clock CLK which has a voltage level of VDD is applied between the input terminals IN1 and IN2 of a level shifter with such a structure and the output VDD0 of the rectifier circuit portion 303 is connected to the V_HI terminal, when the potential of the input terminal IN1 is VDD and the potential of the input terminal IN2 is 0 V, the potential of OUT1 is VDD0 and the potential of OUT2 is 0 V. Conversely, when the potential of the input terminal IN2 is VDD and the potential of the input terminal IN1 is 0 V, the potential of OUT2 is VDD0 and the potential of OUT1 is 0 V.

As a result, the voltage level of the clock CLK is amplified from VDD to VDD0 with the waveform of the clock CLK being maintained.

In a case where this level shifter is applied to the circuit in FIG. 3, since the output VDD0 of the rectifier circuit portion 303 in FIG. 3 is applied to the n-type transistors 801 and 802 and the p-type transistors 803 to 806, it is desirable that these transistors have a higher withstand voltage than thin film transistors usually used in a logic circuit. Specifically, preferably they have a gate length of equal to or greater than 6 μm.

When the level shifter is added to the structure, area increases to some extent; however, since the area of the level shifter is small with respect to the area of the booster circuit, this is not a large problem. Specifically, the ratio of the area of the level shifter to the area of the booster circuit is equal to or less than 5%. Further, the more the number of stages necessary for boosting voltage is decreased by using the present invention, the more the area can be decreased.

Embodiment Mode 3

The third embodiment mode of the present invention will be described below with reference to the drawings.

Figure 5:
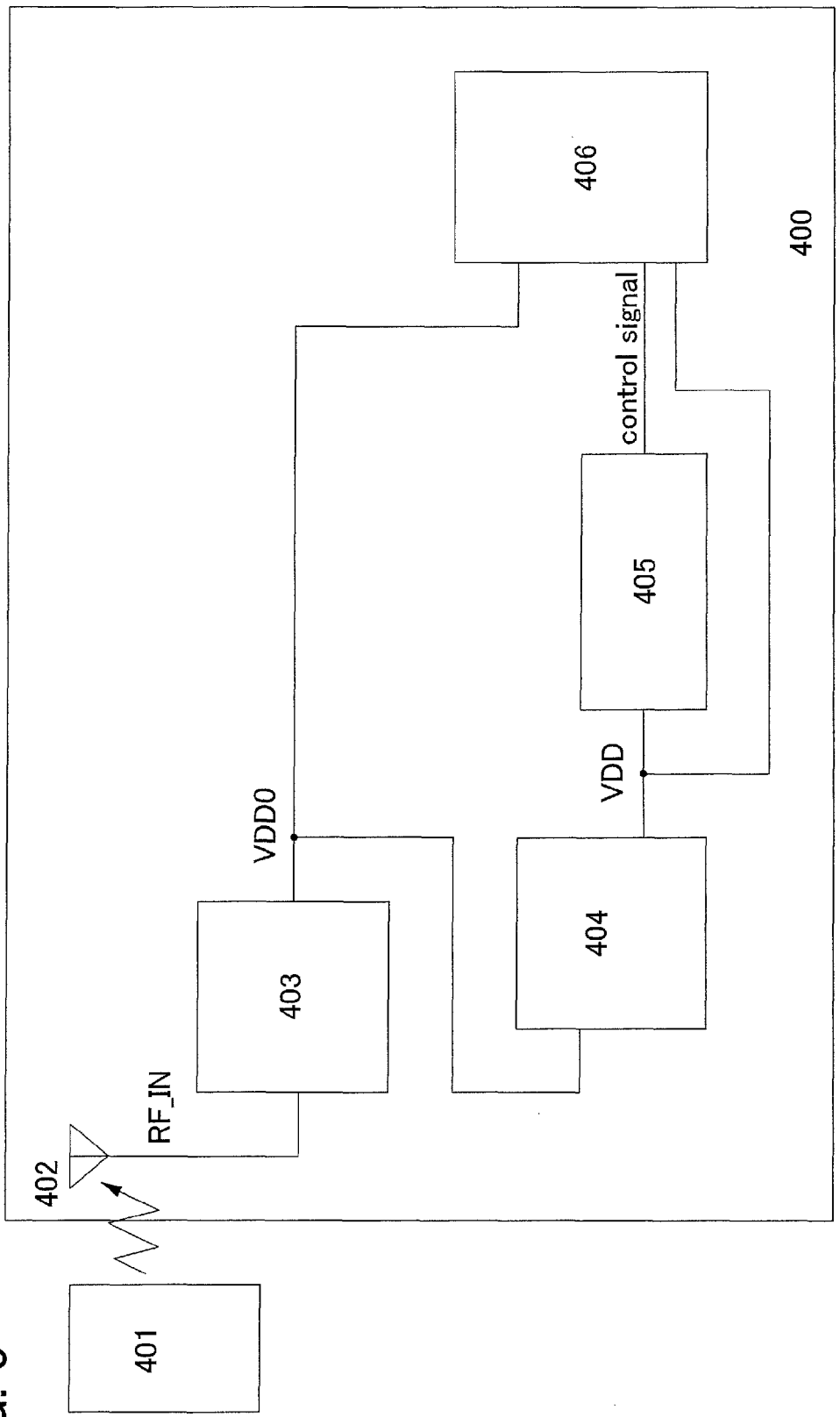
FIG. 5 is a block diagram showing Embodiment Mode 3 of the present invention.

FIG. 5 is a block diagram which shows an RFID to which the present invention has been applied. An RFID 400 in FIG. 5 includes an antenna portion 402 which receives radio waves; a rectifier circuit portion 403 which rectifies output of the antenna portion 402; a regulator circuit 404 which receives output of the rectifier circuit portion 403 and outputs an operating voltage VDD to other circuits; a logic circuit 405 which controls another circuit; and a memory 406 which receives output from the logic circuit 405 and performs data writing and reading.

Note that besides these circuits, the RFID 400 may also include a data modulation/demodulation circuit, a sensor, an interface circuit, and the like, although they are not illustrated.

A reader/writer 401 is a device which writes and reads data to and from the RFID 400 contactlessly from outside.

In this embodiment mode, a booster circuit is not used. The output VDD0 of the rectifier circuit portion 403 is used as a voltage for writing to the memory 406 without being input to the regulator circuit 404 beforehand. The rest of the structures are the same as those in Embodiment Mode 1, so they will not be described here.

A known structure can be used for the memory 406. However, a material used as a memory element of the memory 406 is preferably a material whose characteristics change (open in the case of a fuse memory and short-circuiting in the case of an anti-fuse memory) in a voltage range lower than the output VDD0 of the rectifier circuit portion 403 and higher than the output VDD of the regulator circuit 404.

In this embodiment mode, as shown in FIG. 5, when a booster circuit is not used for data writing to the memory, and the output VDD0 of the rectifier circuit portion 403, which is a higher potential than the output VDD of the regulator circuit 404, is used for data writing to the memory, data writing to the memory can be performed with an even smaller circuit area. Further, because the output VDD of the regulator circuit 404 is used as an operating voltage of other circuits, power consumption can be suppressed.

This structure is especially favorable particularly in cases such as those where the memory is not written to when an RFID is further apart than usual from a reader/writer or in cases where it is inconvenient if the memory is written to when the RFID is further apart than usual from the reader/writer.

Embodiment Mode 4

The fourth embodiment mode of the present invention will be described below with reference to the drawings.

Figure 6:
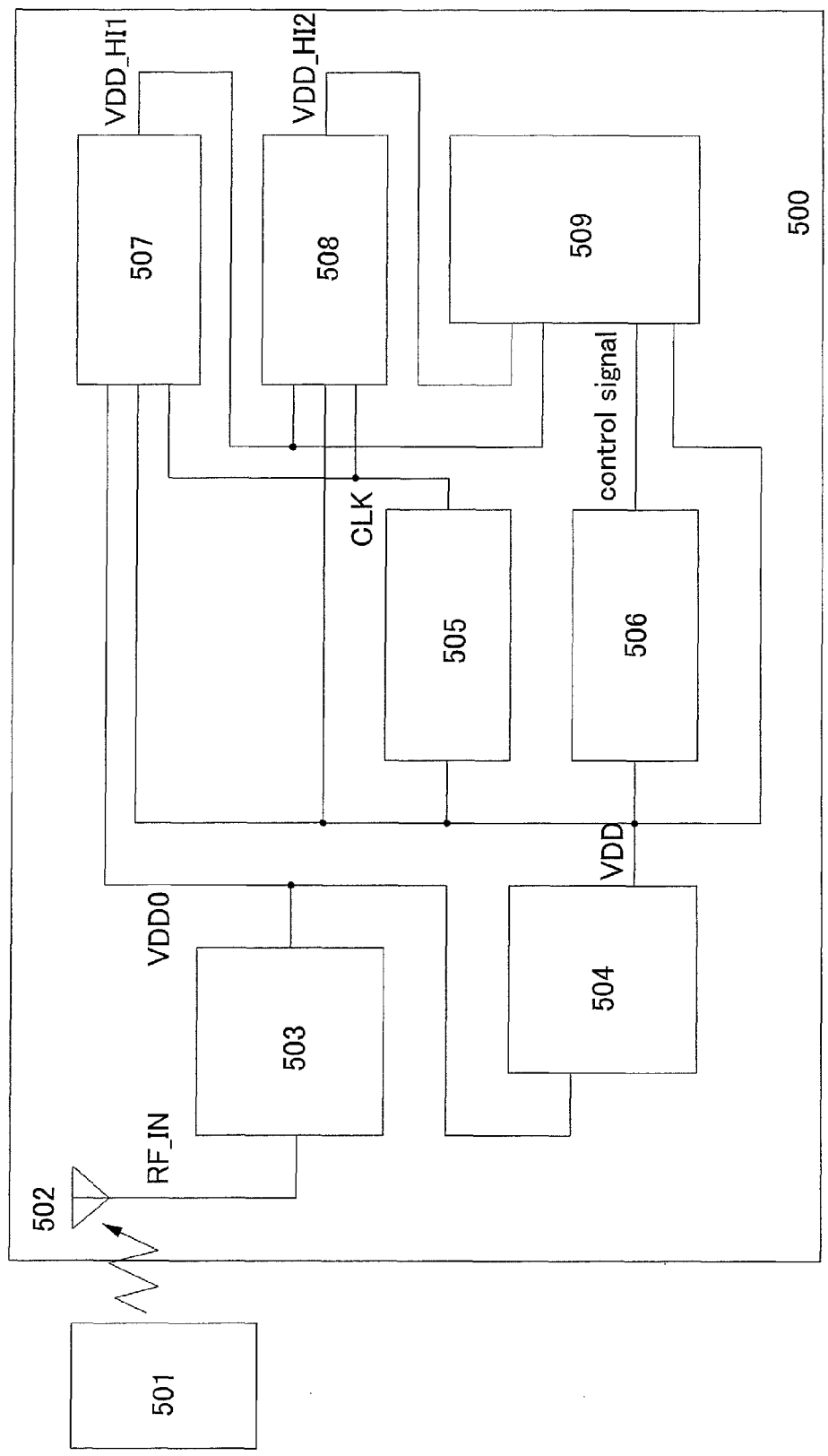
FIG. 6 is a block diagram showing Embodiment Mode 4 of the present invention.

FIG. 6 is a block diagram which shows an RFID to which the present invention has been applied. An RFID 500 in FIG. 6 includes an antenna portion 502 which receives radio waves; a rectifier circuit portion 503 which rectifies output of the antenna portion 502; a regulator circuit 504 which receives output of the rectifier circuit portion 503 and outputs an operating voltage VDD to other circuits; a clock generation circuit 505 which generates clocks; a logic circuit 506 which controls another circuit; a memory 509 which receives output from the logic circuit 506 and writes, reads and erases data; a first booster circuit 507 which receives output of the rectifier circuit portion 503 and output of the clock generation circuit 505 and outputs a boosted voltage; and a second booster circuit 508 which receives output of the first booster circuit 507 and output of the clock generation circuit 505 and outputs a further boosted voltage to the memory 509.

Note that besides these circuits, the RFID 500 may also include a data modulation/demodulation circuit, a sensor, an interface circuit, and the like, although they are not illustrated.

A reader/writer 501 is a device which writes and reads data to and from the RFID 500 contactlessly from outside.

This embodiment mode has the same structure of Embodiment Mode 1 except that it has two booster circuits; therefore, description of parts of the structure other than the booster circuits will be omitted.

In the structure in FIG. 6, output VDD0 of the rectifier circuit portion 503 and output CLK of the clock generation circuit 505 are input to the first booster circuit 507. The first booster circuit 507 uses the CLK to boost the voltage of VDD0 using the same operation as that of the booster circuit in Embodiment Mode 1, and outputs VDD_HI1 VDD_HI1 is input to the second booster circuit 508 as well as to the memory 509.

The output VDD_HI1 of the first booster circuit 507 and the output CLK of the clock generation circuit 505 are input to the second booster circuit 508. The second booster circuit 508 uses the CLK to further boost the voltage of VDD_HI1 using the same operation as that of the booster circuit in Embodiment Mode 1, and outputs VDD_HI2. VDD_HI2 is input to the memory 509.

In the memory 509, for example, the output VDD_HI1 of the first booster circuit 507 can be used as a voltage for data writing, and the output VDD_HI2 of the second booster circuit 508, which has a higher potential than that of VDD_HI1 can be used for data erasing, which requires a higher potential than that for data writing.

When such a structure is used, a rewritable memory, such as a flash memory, can be included in the memory 509. As a result, the RFID which includes the memory is more sophisticated. Note that a known rewritable memory can be used as the memory 509. For example, a flash memory, a ferroelectric memory, or the like can be used.

In this embodiment mode, as shown in FIG. 6, two booster circuits are used; and as the input voltage of the first booster circuit, not the conventionally used output VDD of the regulator circuit 504 but rather the output VDD0 of the rectifier circuit portion 503, which is a higher potential than the VDD, is used; and as the input voltage of the second booster circuit, the output voltage VDD_HI1 of the first booster circuit is used. Accordingly, the high potential necessary for writing and erasing data to and from the memory can be obtained with a small circuit area. Because the output VDD of the regulator circuit 504 is used as operating voltage for other circuits, power consumption can be suppressed.

Note that in this embodiment mode, an example in which two booster circuits are used is described; however, the present invention can also be implemented using three or more booster circuits.

Embodiment Mode 5

The fifth embodiment mode of the present invention will be described below with reference to the drawings.

Figure 7:
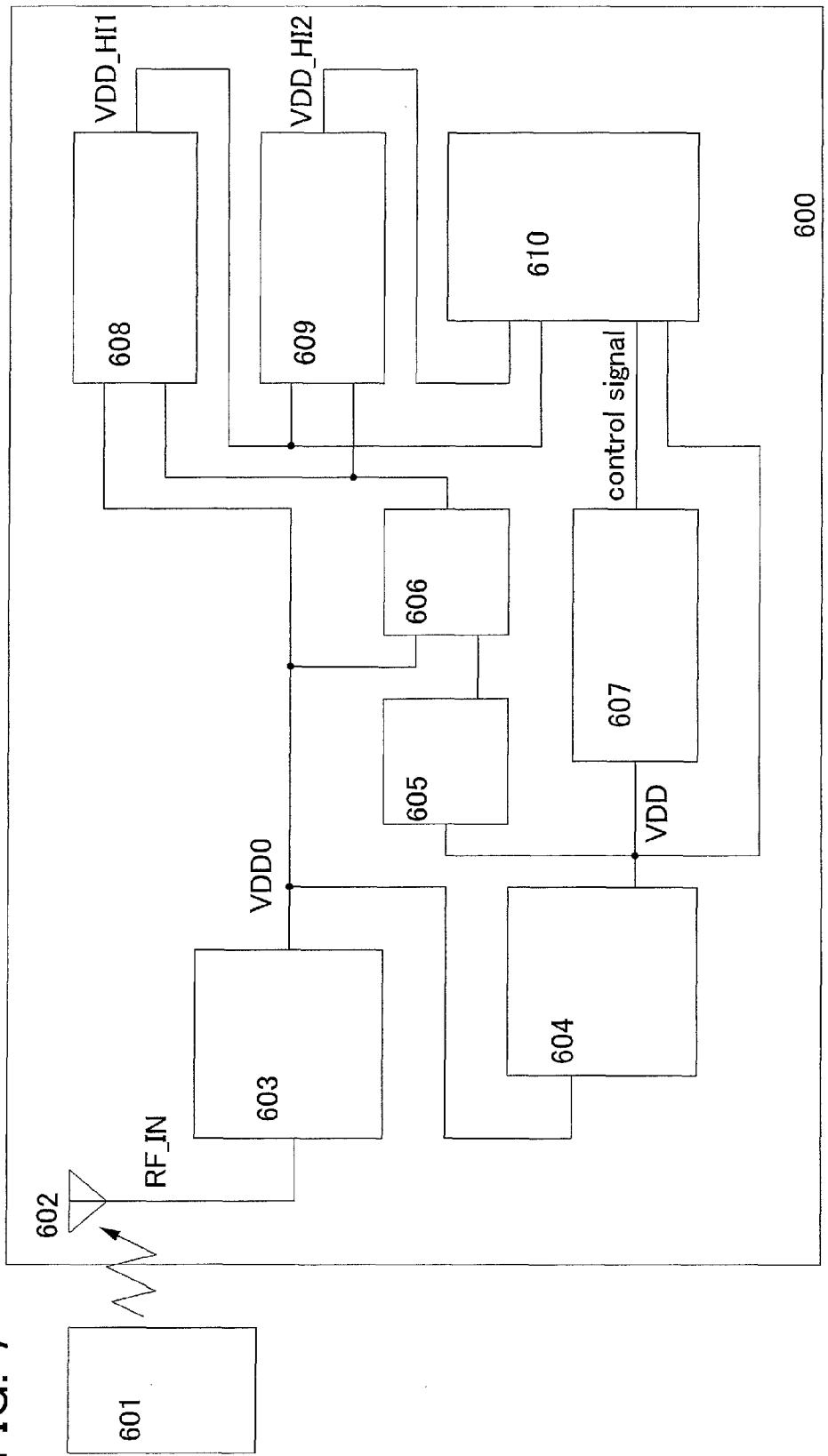
FIG. 7 is a block diagram showing Embodiment Mode 5 of the present invention.

FIG. 7 is a block diagram illustrating an RFID to which the present invention has been applied. In FIG. 7, an RFID 600 includes an antenna portion 602 which receives radio waves; a rectifier circuit portion 603 which rectifies output of the antenna portion 602; a regulator circuit 604 which receives output of the rectifier circuit portion 603 and outputs an operating voltage VDD to other circuits; a clock generation circuit 605 which generates clocks; a level shifter 606 which receives output of the clock generation circuit 605 and output of the rectifier circuit portion 603, amplifies the output of the clock generation circuit 605, and outputs the amplified output of the clock generation circuit 605; a logic circuit 607 which controls another circuit; a memory 610 which receives output from the logic circuit 607 and writes, reads, and erases data; a first booster circuit 608 which receives output of the rectifier circuit portion 603 and output of the level shifter 606, and outputs a boosted voltage; and a second booster circuit 609 which receives output of the first booster circuit 608 and output of the level shifter 606, and outputs a further boosted voltage to the memory 610.

Note that besides these circuits, the RFID 600 may also include a data modulation/demodulation circuit, a sensor, an interface circuit, and the like, although they are not illustrated.

A reader/writer 601 is a device which writes and reads data to and from the RFID 600 contactlessly from outside.

This embodiment mode has the structure of Embodiment Mode 4, with the addition of the level shifter 606. Therefore, description of parts of the structure other than the level shifter 606 will be omitted.

The level shifter 606 amplifies a clock CLK which is output from the clock generation circuit 605. Specifically, when output VDD0 of the rectifier circuit portion 603 is put into the level shifter 606 without having passed through the regulator circuit 604, the potential level of the clock CLK is increased from the level of VDD to the level of VDD0.

In the booster circuit, as described in Embodiment Mode 1 with reference to FIG. 2, voltage is boosted when the voltage of the clock CLK is added to the input voltage. Therefore, when the voltage of the clock CLK is boosted from the level of VDD to the level of VDD0 by the level shifter 606, a high voltage can be obtained even with fewer stages (that is, with a small circuit area).

Therefore, in this embodiment mode, as shown in FIG. 7, in addition to the effects of Embodiment Mode 4, by increasing a CLK of the booster circuit from VDD to VDD0 using the level shifter 606, the high potential necessary for writing and erasing data to and from the memory can be obtained with an even smaller circuit area. Further, because the output VDD of the regulator circuit 604 is used as operating voltage for other circuits, power consumption can be suppressed.

Note that as for Embodiment Mode 4, a known rewritable memory can be used as the memory 610 in this embodiment mode.

Further, details of operation of the level shifter 606 are the same as those of FIG. 4 in Embodiment Mode 2, so description of them is omitted here.

Embodiment 1

In this embodiment, results of a comparison of output of booster circuits of embodiment modes and a conventional example which was conducted by simulation are described with reference to the drawings.

In the simulation, the booster circuit shown in FIG. 2 was used, and voltages of an input and a clock were varied. As the conventional example, voltage of an input Vin and voltage when a clock CLK was HIGH were VDD, and voltage when the CLK was LOW was 0 V. As Method 1, similarly to in Embodiment Mode 1, voltage of the input Vin was VDD0, voltage when a CLK was HIGH was VDD, and voltage when a CLK was low was 0 V. As Method 2, similarly to in Embodiment Mode 2, voltage of an input Vin and voltage when a clock CLK was HIGH were VDD0, and voltage when the CLK was LOW was 0 V.

Further, VDD was 1.7 V, VDD0 was 3 V, and clock frequency was 5 MHz. The capacitor means 211 to 219, which are mid-stage capacitors, each had a capacitance of 7 pF, and the capacitor means 220, which is a final-stage capacitor, had a capacitance of 40 pF.

In the simulation, resistances of 51 kΩ, 100 kΩ, 200 kΩ, 300 kΩ, 510 kΩ, and 1 MΩ were connected to an output Vout as load resistances. Output voltage and current flowing through the resistances were estimated for each method.

Figure 8:
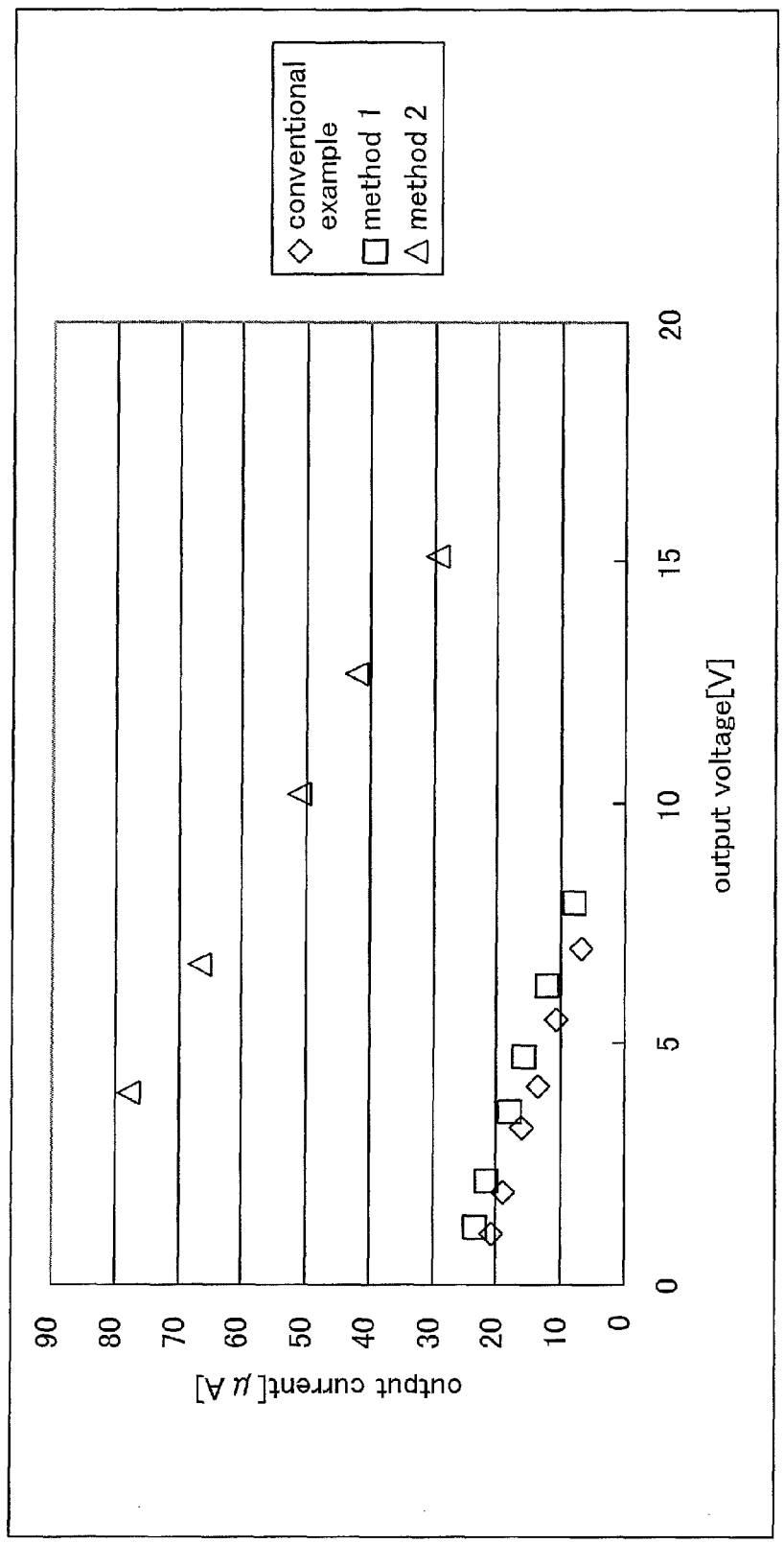
FIG. 8 is a graph showing results of a simulation from Embodiment 1 of the present invention.

Results are shown in FIG. 8. In FIG. 8, the horizontal axis represents output voltage (V), and the vertical axis represents output current (μA). In the figure, results for the conventional example are indicated by ◇ (a diamond shape), results for Method 1 are indicated by □ (a square shape), and results for Method 2 are indicated by Δ (a triangle shape).

As can be seen in FIG. 8, Method 1, which employed the structure of Embodiment Mode 1, showed an improvement of approximately 20% in power supply capacity compared to the conventional example, and Method 2, which employed the structure of Embodiment Mode 2, showed an approximately fourfold improvement in power supply capacity.

Next, an RFID of Method 2, which employed the structure of Embodiment Mode 2; that is, an RFID having a booster circuit in which power supply capacity is increased by using VDD0 as input of the booster circuit and amplifying a clock signal input to the booster circuit from VDD to VDD0 using a level shifter, was actually manufactured, and results of investigating measured values of power supply capacity during writing are described with reference to the drawings.

The structure of the booster circuit was the same as in the simulation conditions. The mid-stage capacitors (the capacitor means 211 to 219 in FIG. 2) each had a capacitance of 7 pF, and the final-stage capacitor (the capacitor means 220 in FIG. 2) had a capacitance of 40 pF. Further, measurement conditions were also the same as in the simulation: VDD was 1.7 V, and VDD0 was 3 V. The experiment was conducted with conditions in which clock frequencies were 5 MHz, the same as that in the simulation, and 3.84 MHz, 2.5 MHz, and 1 MHz. Three RFIDs were manufactured, and measurements were conducted for each of them.

Concerning the method of measurement, the output portion of the high power supply potential VDD_HI of the RFID was disconnected, load resistances of 51 kΩ, 100 kΩ, 200 kΩ, 300 kΩ, 510 kΩ, and 1 MΩ were connected to it, writing operations were performed, and VDD_HI and output current IDD_HI flowing through the resistances were measured.

Figure 9:
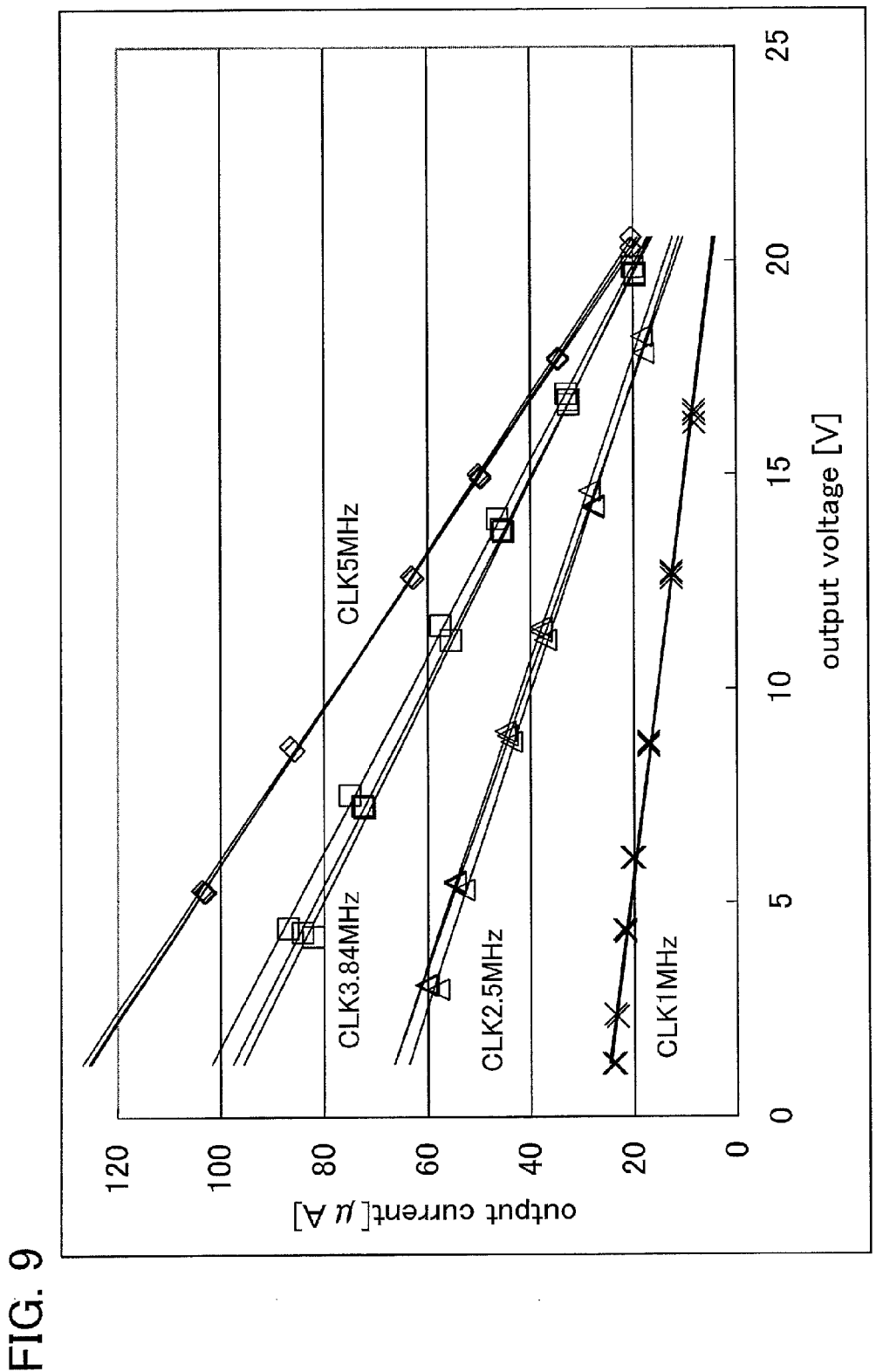
FIG. 9 is a graph showing results of an experiment from Embodiment 1 of the present invention.

Results are shown in FIG. 9. In FIG. 9, the horizontal axis indicates output voltage (V) and the vertical axis indicates output current (μA). In the figure, results for the case where the clock frequency was 5 MHz are indicated by ◇ (a diamond shape); results for a clock frequency of 3.84 MHz are indicated by □ (a square shape); results for a clock frequency of 2.5 MHz are indicated by Δ (a triangle shape); and results for a clock frequency of 1 MHz are indicated by x (a cross). Results obtained for a clock frequency of 5 MHz were almost the same as those obtained for the simulation. It can be seen that a sufficient power supply capacity for writing was obtained. Note that when the clock frequency was reduced, power supply capacity decreased. This is because focusing on a certain capacitor means within the booster circuit, the number of times which the voltage of the capacitor means changes from GND to VDD0 (or from VDD0 to GND) in a unit of time decreases when the clock frequency is lowered; therefore, as a result, the amount of charge which is pushed to the next stage decreases.

However, when the number of clocks with boosted voltage is reduced, current consumption in the booster circuit and current consumption of a circuit which generates clocks can be reduced. Therefore, the most suitable level may be determined as appropriate depending on the electrical power necessary for writing to a memory element.

Thus, as shown in FIG. 9, it was confirmed that results for the RFID of Method 2, which employed the structure of Embodiment Mode 2, were similar to those of the simulation. That is, compared to the conventional example, an approximately fourfold improvement in power supply capacity was observed.

Embodiment 2

In this embodiment, a method of manufacturing a semiconductor device of the present invention which includes a thin film transistor, a memory element, and an antenna of any of the circuits used in Embodiment Modes 1 to 5 will be described with reference to FIGS. 10A to 10D, FIGS. 11A to 11D, and FIGS. 12A and 12B. Note that this embodiment is described using a write-once memory which employs organic material as a memory element; however, the present invention is not limited to this, and a memory element which employs a different structure may be used.

Figure 10A:
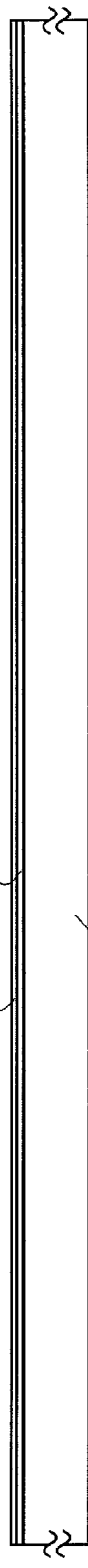
FIGS. 10A to 10D are cross sections showing manufacturing steps of a circuit of Embodiment 2 of the present invention.

First, insulating layers 2001 and 2002 which serve as a base are formed over a substrate 2000 (FIG. 10A). The substrate 2000 may be a glass substrate, a quartz substrate, a metal or stainless steel substrate which has an insulating layer formed over one surface, a plastic substrate which has sufficient heat resistance to withstand processing temperatures of this process, or the like. When such a substrate 2000 is used, there are no large restrictions on its area or shape; therefore, when, for example, a rectangular substrate which has a side of one meter or more is used as the substrate 2000, productivity can be improved markedly. A merit such as this is a large advantage compared with the case of using a circular silicon substrate. Further, when a separation layer is used between the substrate 2000 and the insulating layer 2001, a layer having a thin film transistor can be transposed to a substrate over which a conductive film or the like is formed, and as a result, a connection between a conductive film which is connected to the thin film transistor, and the conductive film which is over the substrate to which the conductive film is transposed to, can be simplified.

Next, the insulating layer 2001 is formed as a first layer using silicon nitride oxide and the insulating layer 2002 is formed as a second layer using silicon oxynitride. The insulating layers 2001 and 2002 are formed as layers which include an oxide of silicon or a nitride of silicon, using a known method (such as a sputtering method or a plasma CVD method). An oxide of silicon is a material which includes silicon (Si) and oxygen (O), and corresponds to silicon oxide, silicon oxynitride, silicon nitride oxide, and the like. A nitride of silicon is a material which includes silicon and nitrogen (N), and corresponds to silicon nitride, silicon oxynitride, silicon nitride oxide, and the like. The insulating layer which serves as the base may be a single layer or a stack of layers. For example, in a case where the insulating layer which serves as the base has a three-layer structure, a silicon oxide layer may be formed as a first insulating layer, a silicon nitride oxide layer may be formed as a second insulating layer, and a silicon oxynitride layer may be formed as a third insulating layer. Alternatively, a silicon oxynitride layer may be formed as a first insulating layer, a silicon nitride oxide layer may be formed as a second insulating layer, and a silicon oxynitride layer may be formed as a third insulating layer. The insulating layer which serves as a base functions as a blocking film which prevents penetration of impurities from the substrate 2000.

Figure 10B:
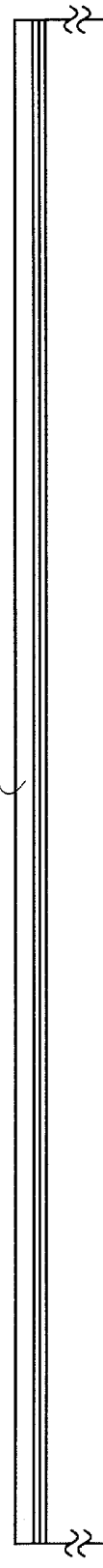
Figure 10C:
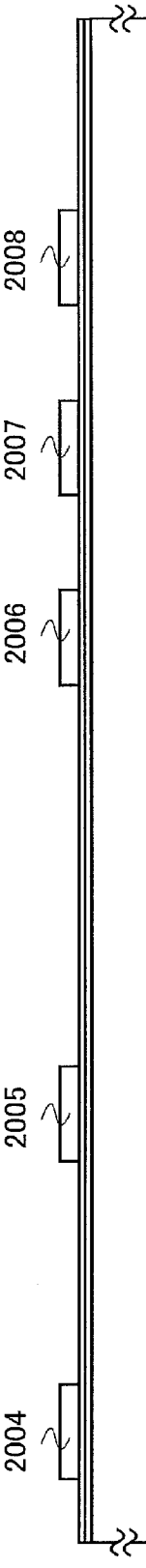

Next, an amorphous semiconductor layer 2003 (for example, a layer including amorphous silicon) is formed over the insulating layer 2002 (FIG. 10B). The amorphous semiconductor layer 2003 is formed to a thickness of 25 to 200 nm (preferably 30 to 150 nm) using a known method (such as a sputtering method, an LPCVD method, or a plasma CVD method). Next, the amorphous semiconductor layer 2003 is crystallized using a known crystallization method (such as a laser crystallization method, a thermal crystallization method which employs RTA or an annealing furnace, a thermal crystallization method which employs a metal element which promotes crystallization, or a method in which a laser crystallization method is combined with a thermal crystallization method which employs a metal element which promotes crystallization) to form a crystalline semiconductor layer. Subsequently, the obtained crystalline semiconductor layer is patterned into a desired shape to form crystalline semiconductor layers 2004 to 2008 (FIG. 10C).

Briefly describing an example of a manufacturing process for the crystalline semiconductor layers 2004 to 2008, first, a plasma CVD method is used to form an amorphous semiconductor layer with a thickness of 66 nm. Next, a solution which includes nickel, which is a metal element that promotes crystallization, is retained on the amorphous semiconductor layer, and the amorphous semiconductor layer is then subjected to dehydrogenation treatment (at 500° C. for one hour) and thermal crystallization treatment (550° C., four hours) to form a crystalline semiconductor layer. Subsequently, laser light irradiation is performed as necessary and patterning treatment which employs a photolithography method is performed, and thereby the crystalline semiconductor layers 2004 to 2008 are formed. In the case of using a laser crystallization method to form the crystalline semiconductor layers, a continuous wave or pulsed gas laser or solid state laser is used. As a gas laser, an excimer laser, a YAG laser, a YVO$_4$ laser, a YLF laser, a YAlO$_3$ laser, a glass laser, a ruby laser, a Ti:sapphire laser, or the like is used. As a solid state laser, a laser which employs a crystal, such as YAG, YVO$_4$, YLF, or YAlO$_3$, which is doped with Cr, Nd, Er, Ho, Ce, Co, Ti, or Tm is used.

Further, when a metal element which promotes crystallization is used to crystallize the amorphous semiconductor layer, while there are advantages in that crystallization can be performed at a low temperature in a short period of time and the direction of crystals is uniform, there are also drawbacks in that because metal element remains on the crystalline semiconductor layer, off-state current increases and characteristics are not stable. Therefore, preferably an amorphous semiconductor layer which functions as a gettering site is formed over the crystalline semiconductor layer. Since it is necessary to include an impurity element such as phosphorus or argon in the amorphous semiconductor layer which serves as the gettering site, preferably the amorphous semiconductor layer is formed using a sputtering method by which argon can be included in the amorphous semiconductor layer at a high concentration. Subsequently, heat treatment (an RTA method, thermal annealing which employs an annealing furnace, or the like) is performed and the metal element is diffused into the amorphous semiconductor layer. Next, the amorphous semiconductor layer which includes the metal element is removed. Thus, the amount of metal element included in the crystalline semiconductor layer can be reduced or metal element included in the crystalline semiconductor layer can be removed from the crystalline semiconductor layer.

Figure 10D:

Next, a gate insulating layer 2009 which covers the crystalline semiconductor layers 2004 to 2008 is formed (FIG. 10D). The gate insulating layer 2009 includes an oxide of silicon or a nitride of silicon and is formed by a known method (such as a plasma CVD method or a sputtering method) as a single layer or a stack of layers. Specifically, a layer including silicon oxide, a layer including silicon oxynitride, or a layer including silicon nitride oxide is formed as a single layer, or such layers are used to form a stack of layers.

Next, a first conductive layer and a second conductive layer are stacked over the gate insulating layer 2009. The first conductive layer is formed to a thickness of 20 to 100 nm by a known method (e.g., a plasma CVD method or a sputtering method). The second conductive layer is formed to a thickness of 100 to 400 nm by a known method. The first conductive layer and the second conductive layer are fainted using any one of the elements tantalum (Ta), tungsten (W), titanium (Ti), molybdenum (Mo), aluminum (Al), copper (Cu), chromium (Cr), niobium (Nb), and the like, or of an alloy material or a compound material which includes such an element as a main constituent. Alternatively, they may be formed of a semiconductor material typified by polycrystalline silicon doped with an impurity element such as phosphorus. Examples which can be given of combinations of the first conductive layer and the second conductive layer include a tantalum nitride layer and a tungsten (W) layer, a tungsten nitride layer and a tungsten layer, a molybdenum nitride layer and a molybdenum (Mo) layer, and the like. Tungsten and tantalum nitride have high heat resistance, so when they are used to form the first conductive layer and the second conductive layer, subsequent to the formation, heat treatment for thermal activation can be performed. Further, in the case of employing a three-layer structure rather than a two-layer structure, a stacked structure which includes a molybdenum layer, an aluminum layer, and another molybdenum layer may be used.

Next, a photolithography method is used to form a resist mask, an etching treatment for forming gate electrodes and gate lines is performed, and conductive layers 2010 to 2014 which function as gate electrodes (sometimes referred to as gate electrode layers) are formed (FIG. 11A).

Next, a resist mask is formed by a photolithography method, and n-type or p-type desired impurity regions 2015*b* to 2019*b* and channel forming regions 2015*a* to 2019*a* are formed in the crystalline semiconductor layers 2004 to 2008 using an ion doping method or an ion implantation method (FIG. 11B). For example, in the case of imparting n-type conductivity, an element which belongs to Group 15 of the periodic table may be used as an impurity element which imparts n-type conductivity. For example, phosphorus (P) or arsenic (As) is used as an impurity element and is added to form n-type impurity regions. Further, in the case of imparting p-type conductivity, a resist mask is formed using a photolithography method, and an impurity element which imparts p-type conductivity, for example, boron (B), is added to a desired crystalline semiconductor layer to form a p-type impurity region.

Next, insulating layers 2020 and 2021 are formed so as to cover the gate insulating layer 2009 and the conductive layers 2010 to 2014 (FIG. 11C). The insulating layers 2020 and 2021 are formed by a known method (such as an SOG method or a droplet discharge method), using an inorganic material such as an oxide of silicon or a nitride of silicon; an organic material such as a polyimide, a polyamide, benzocyclobutene, an acrylic, an epoxy, or a siloxane; or the like. Siloxane has a backbone structure formed of bonds between silicon (Si) and oxygen (O). An organic group containing at least hydrogen (for example, an alkyl group or an aromatic hydrocarbon) is used as a substituent. A fluoro group may also be used as a substituent. Alternatively, a fluoro group and an organic group containing at least hydrogen may be used as a substituent. Further, the insulating layer which covers the gate insulating layer and the conductive layers may be a single layer or a stack of layers. When a three-layer structure is used, a layer including silicon oxide may be formed as a first layer of the insulating layer, a layer including a resin may be formed as a second layer of the insulating layer, and a layer including silicon nitride may be formed as a third layer of the insulating layer Note that before framing the insulating layers 2020 and 2021, or after forming one or more thin films of the insulating layers 2020 and 2021, heat treatment for restoring the crystallinity of the semiconductor layers, activating an impurity element which has been added to the semiconductor layers, or hydrogenating the semiconductor layers may be performed. As the heat treatment, thermal annealing, a laser annealing method, an RTA method, or the like may be used.

Then, the insulating layers 2020 and 2021 are etched to form contact holes which expose the impurity regions 2015*b* to 2019*b*. Next, a conductive layer is formed so that the contact holes are filled, and is patterned to form conductive layers 2022 to 2032 which function as source or drain wirings (FIG. 11D).

The conductive layers 2022 to 2032 are formed as a single layer or as stacked layers by a known method (e.g., a plasma CVD method or a sputtering method) using any of the elements titanium (Ti), aluminum (Al), or neodymium (Nd), or an alloy material or a compound material which contains one of the above-mentioned elements as its main constituent. An alloy material containing aluminum as its main constituent corresponds to, for example, a material which has aluminum as its main constituent and includes nickel, or an alloy material which has aluminum as its main constituent and includes nickel and one or both of carbon and silicon. The conductive layers 2022 to 2032 may employ, for example, a stacked layer structure which includes a barrier layer, an aluminum-silicon (Al—Si) layer, and another barrier layer; or a stacked layer structure which includes a barrier layer, an aluminum-silicon (Al—Si) layer, a titanium nitride layer, and another barrier layer. Note that a barrier layer corresponds to a thin film formed from titanium, a nitride of titanium, molybdenum, or a nitride of molybdenum. Aluminum and aluminum silicon have low resistance and are inexpensive; therefore, they are ideal materials for forming the conductive layers 2022 to 2032. Further, formation of a hillock of aluminum or aluminum silicon can be prevented when upper and lower barrier layers are provided. Further, when a barrier layer is formed from titanium, which is a highly reducible element, even when a thin natural oxide film forms over the crystalline semiconductor layer, the natural oxide film is reduced, and therefore good contact with the crystalline semiconductor layer can be obtained.

Next, insulating layers 2033 and 2034 are formed so as to cover the conductive layers 2022 to 2032 (FIG. 12A). The insulating layers 2033 and 2034 are formed as single layers or as stacked layers, by a known method (such as an SOG method or a droplet-discharge method), using an inorganic material or an organic material.

Subsequently, the insulating layers 2033 and 2034 are etched to form contact holes which expose the conductive layers 2023, 2025, 2026, and 2032. Then, a conductive layer is formed so as to fill the contact holes. The conductive layer is formed by a known method (e.g., a plasma CVD method or a sputtering method) using a conductive material. Next, the conductive layer is patterned to form conductive layers 2035 to 2038 (FIG. 12A). Note that the conductive layers 2035 and 2036 each correspond to one of a pair of conductive layers included in a memory element. Therefore, the conductive layers 2035 to 2038 are preferably formed as a single layer or as stacked layers, using titanium, or an alloy material or a compound material which contains titanium as its main constituent. Titanium has low resistance, which leads to a reduction in the size of the memory element, and therefore high integration can be realized. Further, in an etching process for forming the conductive layers 2035 to 2038, it is preferable to perform wet etching, in order to avoid damaging a thin film transistor in a lower layer. Preferably, hydrogen fluoride (HF) or a mixed solution of ammonia and hydrogen peroxide is used for the etchant.

Then, an insulating layer is formed so as to cover the conductive layers 2035 to 2038. The insulating layer is etched to form contact holes which expose the conductive layers 2035 to 2038, and partition layers (insulating layers) 2039 to 2043 are formed. The partition layers 2039 to 2043 are formed by a known method (such as an SOG method or a droplet-discharge method) as a single layer or as stacked layers, using an inorganic material or an organic material. The partition layers 2039 to 2043 are preferably formed to a thickness of 0.75 to 3 µm.

Next, an organic compound layer 2044 is formed so as to be in contact with the conductive layers 2035 and 2036 (FIG. 12B). A droplet-discharging method, a printing method, a spin coating method, or the like can be used to form the organic compound layer 2044; however, operating efficiency can be improved particularly by using a spin coating method. In a case of using a spin coating method, either a mask is provided in advance, or a photolithography process or the like is used after forming an organic compound layer over an entire surface, enabling an organic compound layer to be provided selectively. Further, by using a droplet-discharging method or a printing method, utilization efficiency of the material can be improved.

Subsequently, a conductive layer 2045 is formed so as to be in contact with the organic compound layer 2044 and the conductive layer 2037. The conductive layer 2045 can be formed by a known method (e.g., a plasma CVD method, a sputtering method, a printing method, or a droplet-discharging method). The conductive layer 2045 functions as a cathode of a memory element, and is connected with ground potential of a circuit via the conductive layer 2037 and the conductive layer 2026.

Subsequently, a conductive layer 2046 which functions as an antenna and which is in contact with the conductive layer 2038 is formed (FIG. 12B). The conductive layer 2046 is formed by a known method (e.g., a plasma CVD method, a sputtering method, a printing method, or a droplet-discharge method) using a conductive material. Preferably, the conductive layer 2046 is formed as a single layer or a stacked layer, using any of the elements aluminum (Al), titanium (Ti), silver (Ag), and copper (Cu), or an alloy material or a compound material which contains one of the above-mentioned elements as its main constituent. As a specific example, the conductive layer 2046 is formed by a screen printing method using a paste which includes silver, and subsequently heat treatment is conducted at 50 to 350° C. Alternatively, an aluminum layer may be formed by a sputtering method and may be patterned to form the conductive layer 2046. Patterning of the aluminum layer is preferably performed using wet etching, and subsequent to the wet etching, preferably heat treatment at 200 to 300° C. is performed.

Next, an insulating layer 2047 which functions as a protective film is provided so as to cover the conductive layers 2045 and 2046 (FIG. 12B). The insulating layer 2047 can be formed as a single layer or a stacked layer structure, using a droplet-discharging method, a printing method, a spin coating method, or the like.

Through the above-described process, a memory element portion formed by stacking the conductive layer 2035, the organic compound layer 2044, and the conductive layer 2045; a memory element portion formed by stacking the conductive layer 2036, the organic compound layer 2044, and the conductive layer 2045; and an antenna formed by stacking the conductive layer 2038 and the conductive layer 2046 can be completed. Accordingly, a semiconductor device which includes an active matrix memory element, an antenna, and a logic circuit can be formed.

Embodiment 3

In this embodiment, an example in which high sophistication of an RFID is achieved by combining any of Embodiment Modes 1 to 5 with an RF battery (a radio frequency battery: a contactless battery which employs a radio frequency) which is a charging element will be described with reference to FIG. 13.

Figure 13:
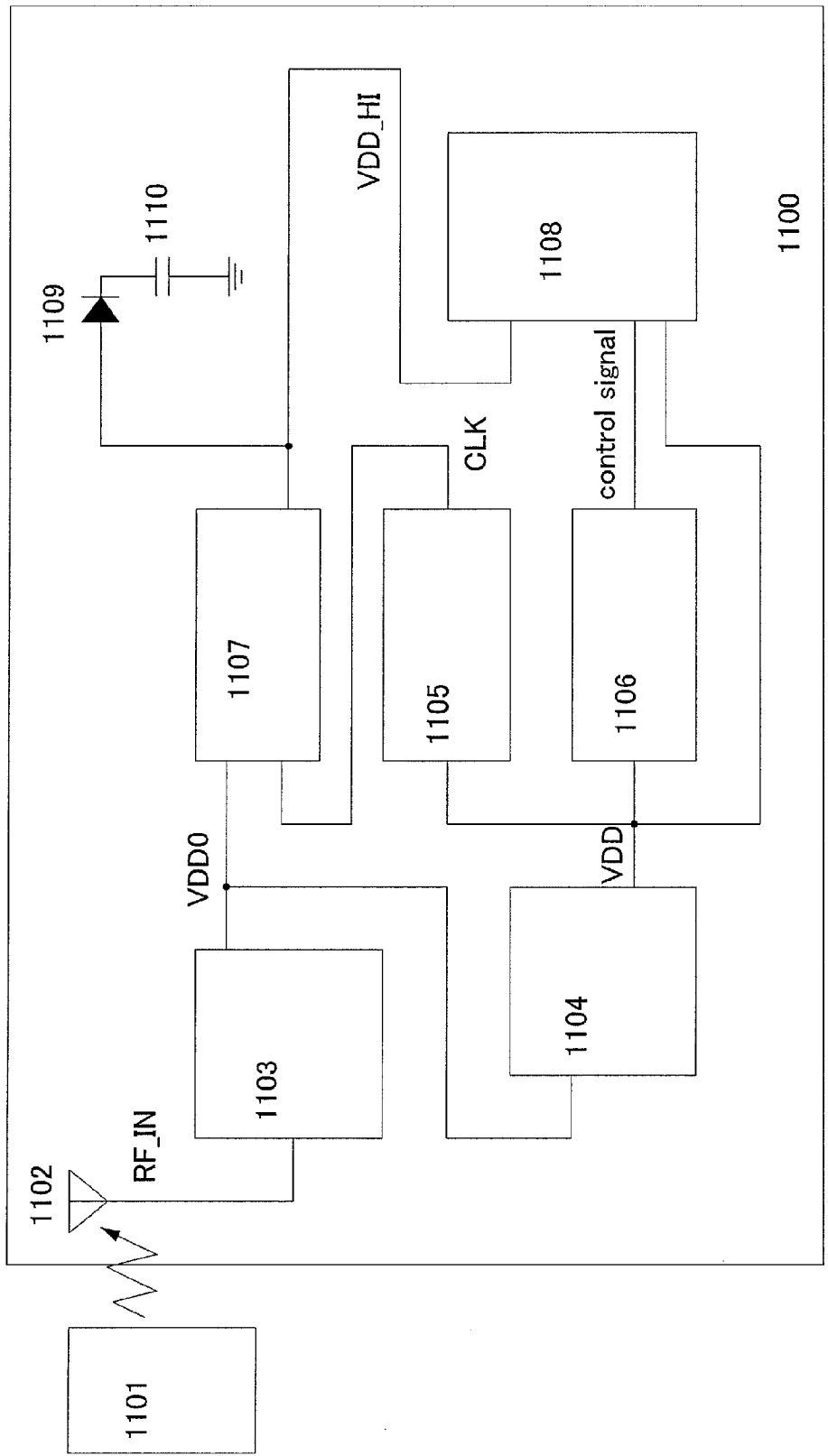
FIG. 13 is a block diagram showing a semiconductor device of Embodiment 3 of the present invention.

FIG. 13 shows an example in which Embodiment Mode 1 has been applied to an RFID which includes an RF battery. An RFID 1100 in FIG. 13 includes an antenna portion 1102 which receives radio waves; a rectifier circuit portion 1103 which rectifies output of the antenna portion 1102; a regulator circuit 1104 which receives output of the rectifier circuit portion 1103 and outputs an operating voltage VDD to other circuits; a clock generation circuit 1105 which generates clocks; a logic circuit 1106 which controls another circuit; a memory 1108 which receives output from the logic circuit 1106 and performs data writing and reading; a booster circuit 1107 which receives output of the rectifier circuit portion 1103 and output of the clock generation circuit 1105 and supplies a voltage for writing data to the memory 1108; a diode 1109 into which output of the booster circuit is input and which prevents reverse flow; and a battery capacitor 1110 which includes a capacitor that stores charge. Output from the diode 1109 is input to the battery capacitor 1110.

Note that besides these circuits, the RFID 1100 may also include a data modulation/demodulation circuit, a sensor, an interface circuit, and the like, although they are not illustrated.

A reader/writer 1101 is a device which writes and reads data to and from the RFID 1100 contactlessly from outside.

An RF battery has features such as the fact that it can charge an object contactlessly and it is very easy to carry. When an RFID includes an RF battery, a memory which requires a power supply, such as an SRAM, can be included in the RFID, and thus the RFID can be made more sophisticated.

In the present invention, output of a booster circuit is used for charging an RFID battery, in order to solve problems such as the one in conventional technology where when an output VDD of a regulator circuit is used to charge an RFID battery, sufficient voltage for charging cannot be obtained because the voltage of VDD is low.

Note that although an example in which the battery capacitor 1110 which includes a capacitor is used as an RF battery has been described here, a secondary battery can be used instead of the capacitor.

In this embodiment, the antenna portion, the rectifier circuit portion, and the booster circuit which are used in the RFID are also used for the RF battery. Therefore, at the same time as the reader/writer 1101 is operating the RFID, it can also be used as a signal transmission source for charging the battery capacitor 1110.

Note that the present invention is not limited to this structure, and one or more of the antenna portion, the rectifier circuit portion, and the booster circuit may be divided into a portion for RFID operation and a portion for RF battery charging. For example, when the antenna portion 1102 is divided into an antenna portion for RFID operation and an antenna portion for RF battery charging, the frequency of signals used for RFID operation can be made different to the frequency of signals used for RF battery charging. In that case, it is desirable that signals emitted by the reader/writer 1101 and signals emitted by a signal transmission source for the RF battery are in frequency domains such that they do not interfere with each other.

Further, when the same antenna portion, rectifier circuit portion, and booster circuit are used for both RFID operation and RF battery charging, a structure may be employed in which a switching element is disposed between the booster circuit 1107 and the diode 1109 for preventing reverse flow, and when a writing operation is being performed, the switch is turned off and the connection between the booster circuit and the RF battery is cut off, and at times other than when a writing operation is being performed, the switch is turned on and the booster circuit and the RF battery are connected. In this case, because charging is not performed during the writing operation, voltage reduction during the writing operation can be prevented. A known structure can be used for the switching element.

Note that although an example in which Embodiment Mode 1 is applied is described in this embodiment, naturally the structure of this embodiment is not limited to employing Embodiment Mode 1, and any of Embodiment Modes 2 to 5 can also be applied.

Further, when any of Embodiment Modes 1, 2, 4, and 5 are applied, instead of connecting the booster circuit to the RF battery, an output of the rectifier circuit portion may be connected to the RF battery.

Embodiment 4

In this embodiment, applications of semiconductor devices which use the embodiment modes will be described with reference to the drawings.

By using the present invention, a semiconductor device which functions as a processor chip (also referred to as an RFID (a radio frequency identification chip), an ID tag, an IC tag, an IC chip, an RF tag, a wireless tag, an electronic tag, and a wireless chip) can be formed. A semiconductor device of the present invention has a wide range of uses. For example, it can be applied to paper money, coins, securities, certificates, bearer bonds, packaging containers, publications, recording media, personal belongings, means of transportation, articles of diet, clothing, healthcare items, lifestyle goods, medicines, electronic devices, and the like.

Figure 14A:
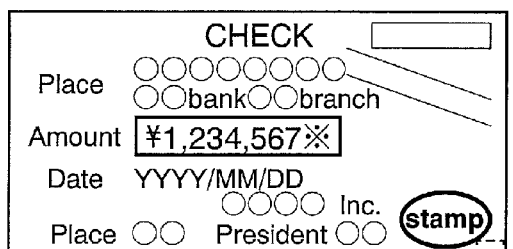
FIGS. 14A to 14G show applications of a semiconductor device of the present invention from Embodiment 4 of the present invention.
Figure 14B:
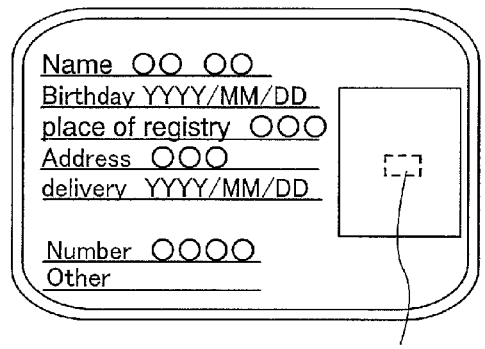
Figure 14C:
Figure 14D:
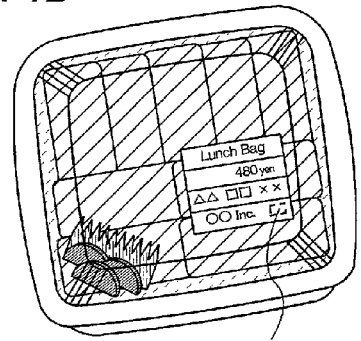
Figure 14E:
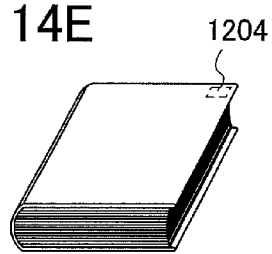
Figure 14F:
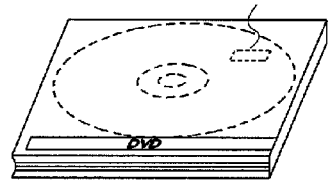
Figure 14G:
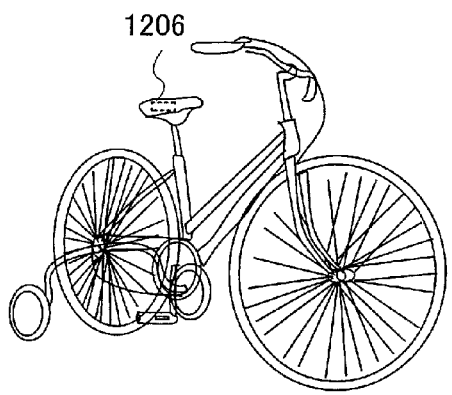

Paper money and coins refer to money that is circulated in the market, and include something that can be used in the same way as money in a specific area (such as a cash voucher), commemorative coins, and the like. Securities refers to checks, bonds, promissory notes, and the like. A processor chip 1200 can be included in a security (see FIG. 14A). A certificate refers to a driver's license, a resident's card, or the like. A processor chip 1201 can be included in a certificate (see FIG. 14B). A personal belonging refers to a bag, glasses, or the like. A processor chip 1202 can be included in a personal belonging (see FIG. 14C). Bearer bonds refers to stamps, rice coupons, various kinds of gift coupons, and the like. A packaging container refers to wrapping paper for a box lunch or the like, a plastic bottle, or the like. A processor chip 1203 can be included in a packaging container (see FIG. 14D). A publication refers to a book, a magazine, or the like. A processor chip 1204 can be included in a publication (see FIG. 14E). A recording medium refers to DVD software, a video tape, or the like. A processor chip 1205 can be included in a recording medium (see FIG. 14F). A means of transportation refers to a ship, a wheeled vehicle such as a bicycle, or the like. A processor chip 1206 can be included in a means of transportation (see FIG. 14G). An article of diet refers to a food, a beverage, or the like. Clothing refers to garments, shoes, and the like. A healthcare item refers to a medical appliance, a healthcare appliance, or the like. Lifestyle goods refers to furniture, light fittings, and the like. A medicine refers to a pharmaceutical, an agricultural chemical, or the like. An electronic device refers to a liquid crystal display device, an EL display device, a television device (e.g., a television receiver, a flat screen television receiver), a cellular phone, or the like.

Further, according to the present invention, a processor chip which is miniaturized or more sophisticated or both is fixed to an article by being mounted on a printed circuit board, attached to a surface, or embedded. For example, in the case of a book, a processor chip may be fixed to the book by being embedded in paper of the book, and in the case of a package formed of organic resin, the processor chip may be fixed to the package by being embedded in the organic resin. A processor chip of the present invention is small, thin, and light, so when it is fixed to an article it does not detract from the design of the article. Further, by including a processor chip of the present invention in paper money, coins, securities, bearer bonds, certificates, or the like, an authentication function can be provided, and by making use of the authentication function, forgery can be prevented. Further, by including a semiconductor device of the present invention in packaging containers, recording media, personal belongings, articles of diet, clothing, lifestyle goods, electronic devices, or the like, the efficiency of a system such as an inspection system or the like can be improved.

Figure 15:
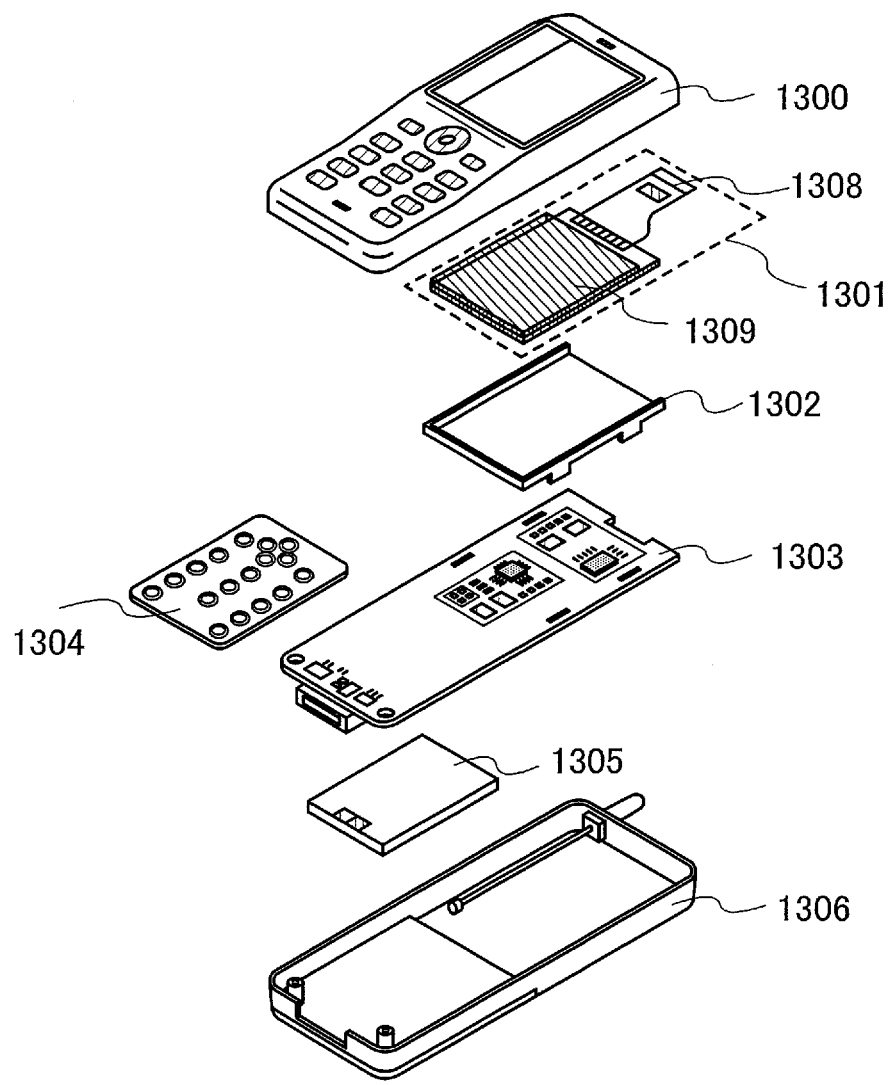
FIG. 15 shows an application of a semiconductor device of the present invention from Embodiment 4 of the present invention.
Figure 16:
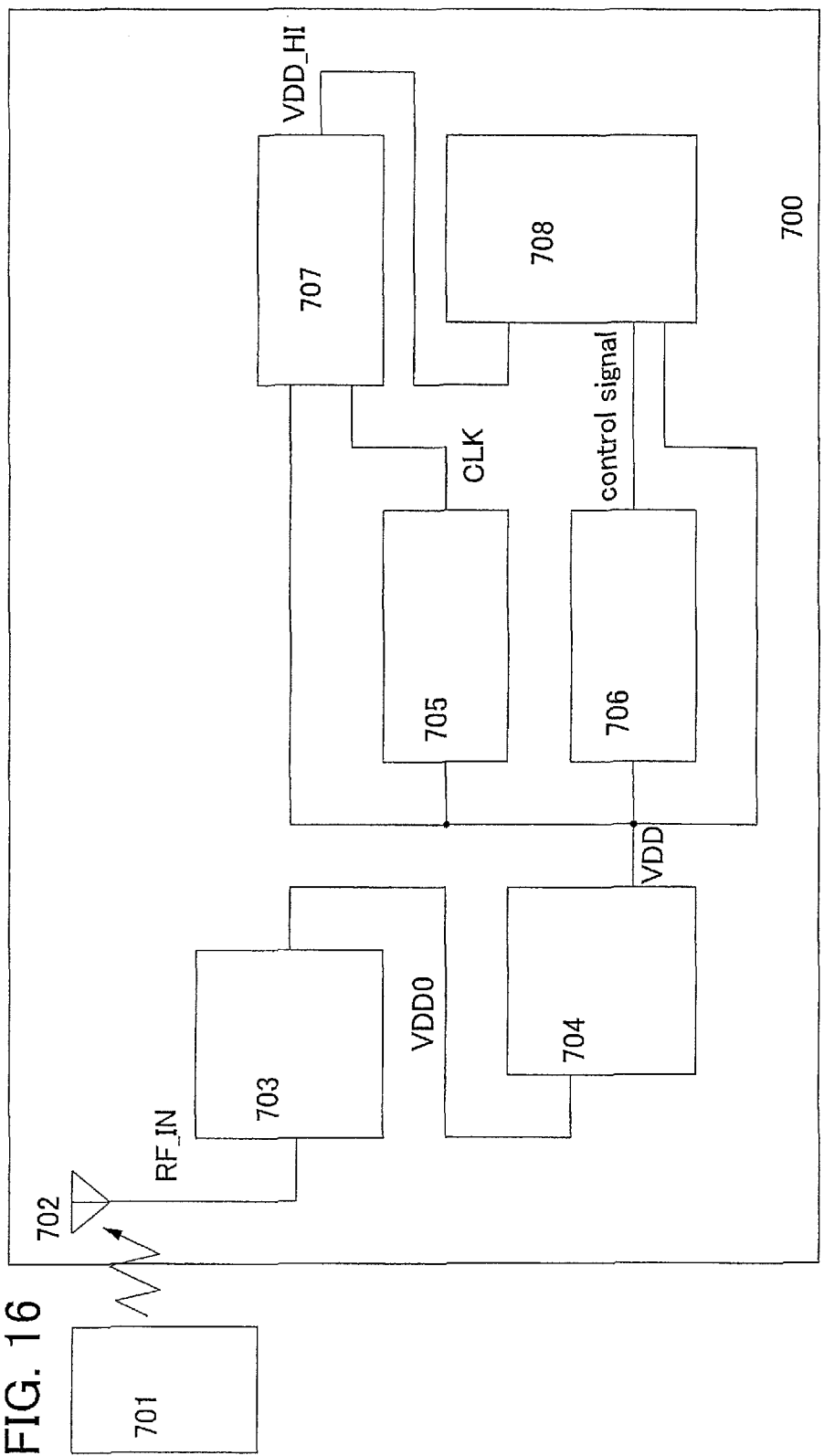
FIG. 16 is a block diagram showing a conventional semiconductor device.

Next, a mode of an electronic device to which a semiconductor device having a capacitor element which relates to the present invention has been mounted will be described with reference to the drawings. An electronic device illustrated in FIG. 15 is a cellular phone which includes cases 1300 and 1306, a panel 1301, a housing 1302, a printed circuit board 1303, control buttons 1304, and a battery 1305. The panel 1301 is detachably incorporated into the housing 1302, and the housing 1302 is fitted to the printed circuit board 1303. The shape and size of the housing 1302 are changed as appropriate to suit the electronic device into which the panel 1301 is incorporated. A plurality of packaged semiconductor devices are mounted on the printed circuit board 1303. A capacitor element of the present invention can be used as one of these semiconductor devices. The plurality of semiconductor devices mounted on the printed circuit board 1303 function as any of the following: a controller, a central processing unit (CPU), a memory, a power supply circuit, an audio processing circuit, a transmitter-receiver circuit, and the like.

The panel 1301 is connected to the printed circuit board 1303 via a connection film 1308. The panel 1301, the housing 1302, and the printed circuit board 1303 are housed within the cases 1300 and 1306, together with the control buttons 1304 and the battery 1305. A pixel region 1309 included in the panel 1301 is disposed such that it is visible through an aperture window provided in the case 1300.

As described above, the semiconductor device to which the capacitor element of the present invention is applied is small, thin, and light, and because it has these characteristics, the limited space within the cases 1300 and 1306 of the electronic device can be utilized effectively.

Note that the cases 1300 and 1306 are described as one example of the form of the exterior of the cellular phone, and the electronic device relating to this embodiment can take various forms depending on its functions and uses.

The present application is based on Japanese Patent Application Serial No. 2006-270234 filed on 2 Oct. 2006 with the Japanese Patent Office, the entire contents of which are hereby incorporated by reference.

What is claimed is:

1. A semiconductor device comprising:
    an antenna portion;
    a first circuit configured to rectify an output of the antenna portion and configured to output a direct current voltage, the output of the first circuit being used as a first power supply potential;
    a second circuit configured to receive an output of the first circuit and configured to output a specific voltage, the output of the second circuit being used as a second power supply potential;
    a third circuit configured to receive the output of the first circuit and configured to boost the first power supply potential, the third circuit comprising a first booster circuit configured to boost the first power supply potential and a second booster circuit configured to boost an output of the first booster circuit; and
    a memory configured to receive an output of the second booster circuit.

2. The semiconductor device according to claim 1, further comprising:
    a fourth circuit, into which the second power supply potential is input, and which is configured to generate clocks for the first booster circuit and the second booster circuit; and a level shifter, into which the first power supply potential and an output of the fourth circuit are input, and which is configured to amplify the output of the fourth circuit and configured to output the amplified output of the fourth circuit as a clock of the first booster circuit and the second booster circuit.

3. The semiconductor device according to claim 1, further comprising a charging element into which the first power supply potential is input and which stores charge.

4. The semiconductor device according to claim 3, further comprising a switching element which is between the charging element and the first circuit.

5. The semiconductor device according to claim 3, wherein the charging element is a capacitor.

6. The semiconductor device according to claim 3, wherein the charging element is a secondary battery.

7. The semiconductor device according to claim 1, further comprising a charging element, into which an output of the third circuit is input, and which stores charge.

8. The semiconductor device according to claim 7, further comprising a switching element that is between the charging element and the third circuit.

9. The semiconductor device according to claim 1, further comprising a charging element, into which the output of the first booster circuit or the output of the second booster circuit is input, and which stores charge.

10. The semiconductor device according to claim 9, further comprising a switching element that is between the charging element and the first booster circuit or the second booster circuit.

11. An electronic device comprising the semiconductor device from claim 1.

12. A semiconductor device comprising:
    an antenna portion;
    a first circuit configured to rectify an output of the antenna portion and configured to output a direct current voltage, the output of the first circuit being used as a first power supply potential;
    a second circuit configured to receive an output of the first circuit and configured to output a specific voltage, the output of the second circuit being used as a second power supply potential;
    a third circuit configured to receive the output of the first circuit and configured to boost the first power supply potential, the third circuit comprising a first booster circuit configured to boost the first power supply potential and a second booster circuit configured to boost an output of the first booster circuit; and
    a memory configured to receive the output of the first booster circuit and an output of the second booster circuit.

13. The semiconductor device according to claim 12, further comprising:
    a fourth circuit, into which the second power supply potential is input, and which is configured to generate clocks for the first booster circuit and the second booster circuit; and
    a level shifter, into which the first power supply potential and an output of the fourth circuit are input, and which is configured to amplify the output of the fourth circuit and configured to output the amplified output of the fourth circuit as a clock of the first booster circuit and the second booster circuit.

14. The semiconductor device according to claim 12, further comprising a charging element into which the first power supply potential is input and which stores charge.

15. The semiconductor device according to claim 14, further comprising a switching element which is between the charging element and the first circuit.

16. The semiconductor device according to claim 14, wherein the charging element is a capacitor.

17. The semiconductor device according to claim 14, wherein the charging element is a secondary battery.

18. The semiconductor device according to claim 12, further comprising a charging element, into which an output of the third circuit is input, and which stores charge.

19. The semiconductor device according to claim 18, further comprising a switching element that is between the charging element and the third circuit.

20. The semiconductor device according to claim 12, further comprising a charging element, into which the output of the first booster circuit or the output of the second booster circuit is input, and which stores charge.

21. The semiconductor device according to claim 20, further comprising a switching element that is between the charging element and the first booster circuit or the second booster circuit.

22. An electronic device comprising the semiconductor device from claim 12.

* * * * *